(12) United States Patent
Kushibe et al.

(10) Patent No.: US 8,937,325 B2
(45) Date of Patent: Jan. 20, 2015

(54) SEMICONDUCTOR DEVICE, WAFER, METHOD FOR MANUFACTURING SEMICONDUCTOR DEVICE, AND METHOD FOR MANUFACTURING WAFER

(75) Inventors: Mitsuhiro Kushibe, Tokyo (JP); Yasuo Ohba, Kanagawa-ken (JP); Hiroshi Katsuno, Tokyo (JP); Kei Kaneko, Kanagawa-ken (JP); Shinji Yamada, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 299 days.

(21) Appl. No.: 13/406,740

(22) Filed: Feb. 28, 2012

(65) Prior Publication Data
US 2013/0069033 A1 Mar. 21, 2013

(30) Foreign Application Priority Data
Sep. 15, 2011 (JP) .................................. 2011-202323

(51) Int. Cl.
*H01L 33/00* (2010.01)
*H01L 33/06* (2010.01)
*H01L 33/32* (2010.01)

(52) U.S. Cl.
CPC ................ *H01L 33/06* (2013.01); *H01L 33/32* (2013.01); *H01L 33/0079* (2013.01)
USPC 257/97; 257/94; 257/E33.003; 257/E33.008; 257/E33.043

(58) Field of Classification Search
USPC ........ 257/94, 97, E33.003, E33.008, E33.043
See application file for complete search history.

(56) References Cited

U.S. PATENT DOCUMENTS

| 7,576,363 B2* | 8/2009 | Uemura et al. ................. 257/94 |
| 2007/0122994 A1* | 5/2007 | Sonobe et al. ................. 438/426 |
| 2010/0133562 A1* | 6/2010 | Zhang et al. ................... 257/94 |
| 2010/0155704 A1* | 6/2010 | Oh et al. ........................ 257/28 |

FOREIGN PATENT DOCUMENTS

| JP | 2007-150076 | 6/2007 |
| JP | 2008-539585 | 11/2008 |
| JP | 2010-21576 | 1/2010 |
| JP | 2010-205988 | 9/2010 |

OTHER PUBLICATIONS

Japanese Office Action issued Jul. 11, 2012, in Japan Patent Application No. 2011-202323 (with English translation).

* cited by examiner

*Primary Examiner* — Minchul Yang
(74) *Attorney, Agent, or Firm* — Oblon, Spivak, McClelland, Maier & Neustadt, L.L.P.

(57) ABSTRACT

According to one embodiment, a semiconductor device includes a first layer of n-type including a nitride semiconductor, a second layer of p-type including a nitride semiconductor, a light emitting unit, and a first stacked body. The light emitting unit is provided between the first and second layers. The first stacked body is provided between the first layer and the light emitting unit. The first stacked body includes a plurality of third layers including AlGaInN, and a plurality of fourth layers alternately stacked with the third layers and including GaInN. The first stacked body has a first surface facing the light emitting unit. The first stacked body has a depression provided in the first surface. A part of the light emitting unit is embedded in a part of the depression. A part of the second layer is disposed on the part of the light emitting unit.

18 Claims, 12 Drawing Sheets

US 8,937,325 B2

SEMICONDUCTOR DEVICE, WAFER, METHOD FOR MANUFACTURING SEMICONDUCTOR DEVICE, AND METHOD FOR MANUFACTURING WAFER

CROSS-REFERENCE TO RELATED APPLICATIONS

This application is based upon and claims the benefit of priority from the prior Japanese Patent Application No. 2011-202323, filed on Sep. 15, 2011; the entire contents of which are incorporated herein by reference.

FIELD

Embodiments described herein relate generally to a semiconductor device, a wafer, a method for manufacturing the semiconductor device, and a method for manufacturing the wafer.

BACKGROUND

Nitride semiconductors are used in various semiconductor devices such as semiconductor light emitting devices and HEMT (high electron mobility transistor) devices. However, the characteristics of such nitride semiconductor devices are restricted by high density threading dislocations due to lattice mismatch with the GaN crystal.

For instance, semiconductor light emitting devices based on nitride semiconductors are expected as a phosphor-exciting light source for e.g. white LED, but have low efficiency.

Various proposals have been made to increase the efficiency of LED and other semiconductor light emitting devices based on nitride semiconductors.

DETAILED DESCRIPTION

Figure 1:
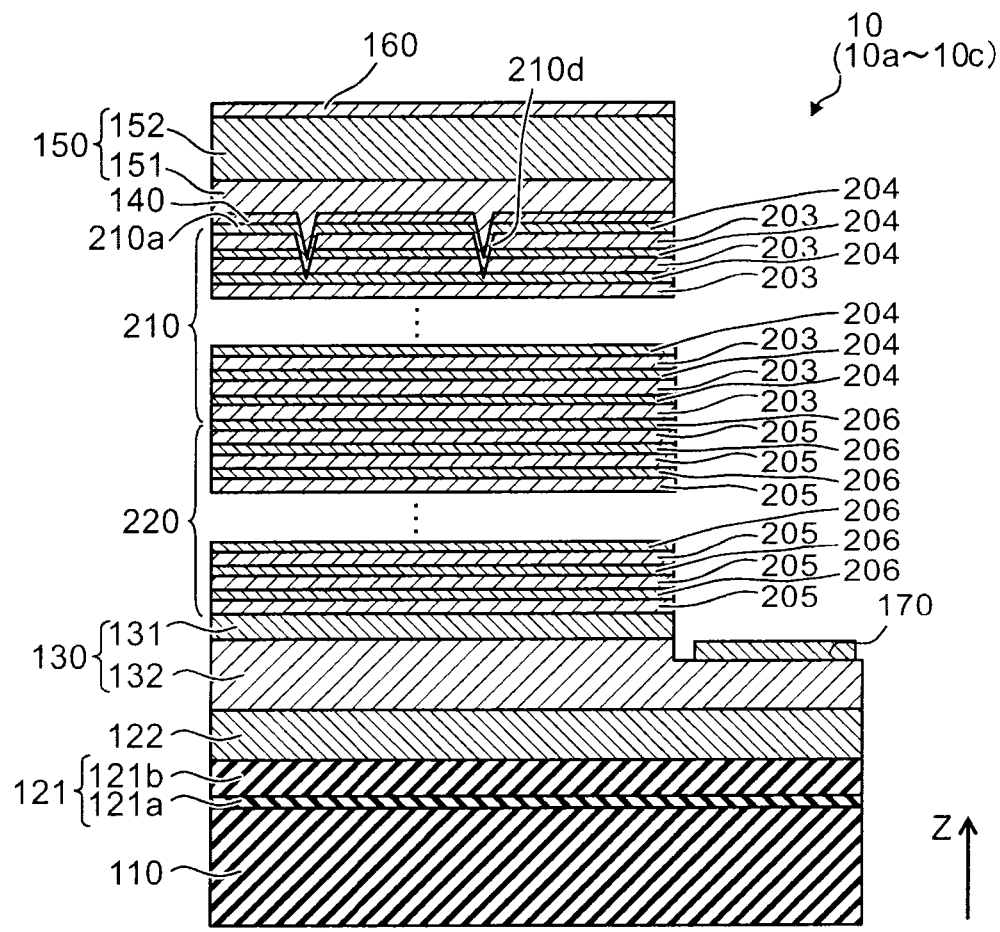
FIG. 1 is a schematic sectional view illustrating a semiconductor device according to a first embodiment.

According to one embodiment, a semiconductor device includes a first layer of n-type including a nitride semiconductor, a second layer of p-type including a nitride semiconductor, a light emitting unit, and a first stacked body. The light emitting unit is provided between the first layer and the second layer. The light emitting unit includes a barrier layer and a well layer. The first stacked body is provided between the first layer and the light emitting unit. The first stacked body includes a plurality of third layers including AlGaInN, and a plurality of fourth layers alternately stacked with the plurality of third layers and including GaInN. The first stacked body has a first surface facing the light emitting unit. The first stacked body has a depression provided in the first surface. A part of the light emitting unit is embedded in at least a part of the depression. A part of the second layer is disposed on the part of the light emitting unit embedded in the at least a part of the depression.

According to another embodiment, a semiconductor device includes a first layer of n-type including a nitride semiconductor, a second layer of p-type including a nitride semiconductor, a light emitting unit, a first stacked body, and a second stacked body. The light emitting unit is provided between the first layer and the second layer. The light emitting unit includes a barrier layer and a well layer. The first stacked body is provided between the first layer and the light emitting unit. The first stacked body includes a plurality of third layers including AlGaInN, and a plurality of fourth layers alternately stacked with the plurality of third layers and including GaInN. The second stacked body is provided between the first layer and the first stacked body. The second stacked body includes a plurality of fifth layers having a composition different from a composition of the third layers and including a nitride semiconductor, and a plurality of sixth layers alternately stacked with the plurality of fifth layers and including GaInN. The second stacked body includes a first portion near the first layer and a second portion located between the first portion and the light emitting unit. An In average concentration in the first portion is higher than an In average concentration in the second portion.

According to another embodiment, a wafer includes a substrate, a first layer of n-type, a first stacked body, a light emitting unit, and a second layer of p-type. The first layer of n-type is provided on the substrate and includes a nitride semiconductor. The first stacked body is provided on the first layer. The first stacked body includes a plurality of third layers including AlGaInN, and a plurality of fourth layers alternately stacked with the plurality of third layers and including GaInN. The light emitting unit is provided on the first stacked body. The light emitting unit includes a plurality of barrier layers and a well layer provided between the plurality of barrier layers. The second layer of p-type is provided on the light emitting unit and includes a nitride semiconductor. The first stacked body has a first surface facing of the light emitting unit. The first stacked body has a depression provided in the first surface. A part of the light emitting unit and a part of the second layer are embedded in at least a part of the depression.

According to another embodiment, a wafer includes a first layer of n-type including a nitride semiconductor, a second layer of p-type including a nitride semiconductor, a light emitting unit, a first stacked body, and a second stacked body. The light emitting unit is provided between the first layer and the second layer. The light emitting unit includes a plurality of barrier layers and a well layer provided between the plurality of barrier layers. The first stacked body is provided between the first layer and the light emitting unit. The first stacked body includes a plurality of third layers including AlGaInN, and a plurality of fourth layers alternately stacked with the plurality of third layers and including GaInN. The second stacked body is provided between the first layer and the first stacked body. The second stacked body includes a plurality of fifth layers having a composition different from a composition of the third layers and including a nitride semiconductor, and a plurality of sixth layers alternately stacked with the plurality of fifth layers and including GaInN. The second stacked body includes a first portion near the first layer and a second portion located between the first portion and the light emitting unit. An In average concentration in the first portion is higher than an In average concentration in the second portion.

According to another embodiment, a method is disclosed for manufacturing a semiconductor device. The method can include forming a first layer of n-type including a nitride semiconductor on a substrate. The method can include forming a first stacked body by alternately stacking a plurality of third layers including AlGaInN and a plurality of fourth layers including GaInN on the first layer. The method can include forming a light emitting unit including a plurality of barrier layers and a well layer provided between the plurality of barrier layers on the first stacked body. In addition, the method can include forming a second layer of p-type including a nitride semiconductor on the light emitting unit. The first stacked body has a first surface facing the light emitting unit. The first stacked body has a depression provided in the first surface. The forming the light emitting unit includes embedding a part of the light emitting unit in at least a part of the depression. The forming the second layer includes embedding a part of the second layer in at least a part of a remaining space of the depression.

According to another embodiment, a method is disclosed for manufacturing a semiconductor device. The method can include determining a crystal growth condition when forming a second stacked body by alternately stacking a plurality of fifth layers including a nitride semiconductor and a plurality of sixth layers including GaInN on a first layer of n-type including a nitride semiconductor, and forming a first stacked body by alternately stacking a plurality of third layers having a composition different from the fifth layers and including AlGaInN and a plurality of fourth layers including GaInN on the second stacked body. The second stacked body has a first portion and a second portion being farther from the first layer than the first portion. The crystal growth condition makes an In average concentration in the first portion being higher than an In average concentration in the second portion. The method can include forming the second stacked body and the first stacked body by using the determined crystal growth condition, forming a light emitting unit including a barrier layer and a well layer on the first stacked body, and forming a second layer of p-type including a nitride semiconductor on the light emitting unit.

According to another embodiment, a method is disclosed for manufacturing a wafer. The method can include forming a first layer of n-type including a nitride semiconductor on a substrate. The method can include forming a first stacked body by alternately stacking a plurality of third layers including AlGaInN and a plurality of fourth layers including GaInN on the first layer. The method can include forming a light emitting unit including a plurality of barrier layers and a well layer provided between the plurality of barrier layers on the first stacked body. In addition, the method can include forming a second layer of p-type including a nitride semiconductor on the light emitting unit. The first stacked body has a first surface facing the light emitting unit. The first stacked body has a depression provided in the first surface. The forming the light emitting unit includes embedding a part of the light emitting unit in at least a part of the depression. The forming the second layer includes embedding a part of the second layer in at least a part of a remaining space of the depression. Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with the same reference numerals, and the detailed description thereof is omitted appropriately.

(First Embodiment)

The embodiment relates to a semiconductor device. The semiconductor device according to the embodiment includes a semiconductor device such as a semiconductor light emitting device, a semiconductor light receiving device, and an electron device. The semiconductor light emitting device includes e.g. a light emitting diode (LED) and a laser diode (LD). The semiconductor light receiving device includes e.g. a photodiode (PD). The electron device includes e.g. a high electron mobility transistor (HEMT), a heterojunction bipolar transistor (HBT), a field effect transistor (FET), and a Schottky barrier diode (SBD).

In the following, examples in which the embodiment is applied to a semiconductor light emitting device are described.

FIG. 1 is a schematic sectional view illustrating the configuration of a semiconductor device according to the first embodiment.

As shown in FIG. 1, the semiconductor device 10 according to the embodiment includes a first layer 130, a second layer 150, a light emitting unit 140 (functional section), and a first stacked body 210.

The first layer 130 includes a nitride semiconductor and has n-type. The second layer 150 includes a nitride semiconductor and has p-type.

In this example, the first layer 130 includes an n-type confinement layer 131 and an n-type contact layer 132. The n-type confinement layer 131 is placed between the n-type contact layer 132 and the light emitting unit 140. The n-type confinement layer 131 includes e.g. at least one of n-type GaN and n-type AlGaN.

In this example, the second layer 150 includes a p-type confinement layer 151 and a p-type contact layer 152. The p-type confinement layer 151 is placed between the p-type contact layer 152 and the light emitting unit 140. The p-type confinement layer 151 includes e.g. p-type AlGaN.

The light emitting unit 140 is provided between the first layer 130 and the second layer 150. The light emitting unit 140 includes a barrier layer (described later) and a well layer (described later). For instance, a plurality of barrier layers are provided. The well layer is provided between the plurality of barrier layers.

The first stacked body 210 is provided between the first layer 130 and the light emitting unit 140. The first stacked body 210 includes a plurality of third layers 203 and a plurality of fourth layers 204. The plurality of fourth layers 204 are alternately stacked with the plurality of third layers 203. The third layers 203 include e.g. AlGaInN. The plurality of fourth layers 204 include e.g. GaInN. The thickness of each fourth layer 204 may be thinner than the thickness of the well layer (described later) of the light emitting unit 140.

Here, the direction from the first layer 130 toward the second layer 150 is defined as Z-axis direction. For instance, the first layer 130, the first stacked body 210, the light emitting unit 140, and the second layer 150 are stacked in this order along the Z-axis direction.

In the description, the stacked state of layers includes not only the state in which the layers are directly stacked, but also the state in which the layers are stacked with a different component interposed therebetween.

The first stacked body 210 is provided on the first layer 130. The light emitting unit 140 is provided on the first stacked body 210. The second layer 150 is provided on the light emitting unit 140.

In the description, the state of being provided on a layer includes not only the state of being placed on the layer in contact therewith, but also the state of being placed on the layer with a different component interposed.

In this example, the semiconductor device 10 further includes a second stacked body 220. The second stacked body 220 is provided between the first layer 130 and the first stacked body 210. The second stacked body 220 includes a plurality of fifth layers 205 and a plurality of sixth layers 206. The plurality of sixth layers 206 are alternately stacked with the plurality of fifth layers 205. The plurality of fifth layers 205 have a composition different from the composition of the third layers 203. The fifth layer 205 is made of e.g. GaN. The sixth layer 206 includes GaInN. The thickness of the sixth layer 206 may be thinner than the thickness of the well layer (described later) of the light emitting unit 140.

For instance, in the semiconductor device 10, for instance, on the major surface of a substrate 110, a first buffer layer 121 of AlN is provided. The major surface of the substrate 110 is made of e.g. a sapphire c-plane. On the substrate 110, a second buffer layer 122 of non-doped GaN is provided. Specifically, the first buffer layer 121 includes a first AlN buffer layer 121a of high carbon concentration formed on the substrate 110, and a second AlN buffer layer 121b of high purity formed on the first AlN buffer layer 121a. The carbon concentration in the first AlN buffer layer 121a is higher than the carbon concentration in the second AlN buffer layer 121b.

On the second buffer layer 122, for instance, an n-type contact layer 132 of Si-doped n-type GaN, a Si-doped n-type confinement layer 131, a light emitting unit 140, a p-type confinement layer 151 of Mg-doped p-type AlGaN, and a p-type contact layer 152 of Mg-doped p-type GaN are stacked.

Furthermore, on the p-type contact layer 152, for instance, a p-side electrode 160 of Ni is provided. On the n-type contact layer 132, for instance, an n-side electrode 170 of Al/Au stacked film is provided.

By applying voltage between the p-side electrode 160 and the n-side electrode 170, a current is supplied to the light emitting unit 140, and light (emission light) is emitted from the light emitting unit 140.

FIGS. 2A to 2D are schematic sectional views illustrating a partial configuration of semiconductor devices according to the first embodiment.

Figure 2A:
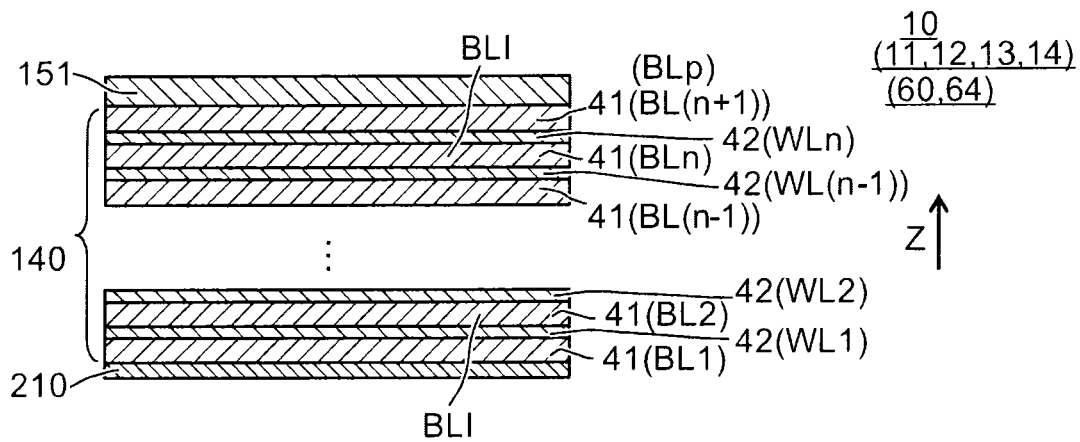
FIGS. 2A to 2D are schematic sectional views illustrating a part of semiconductor devices according to the first embodiment.
Figure 2B:
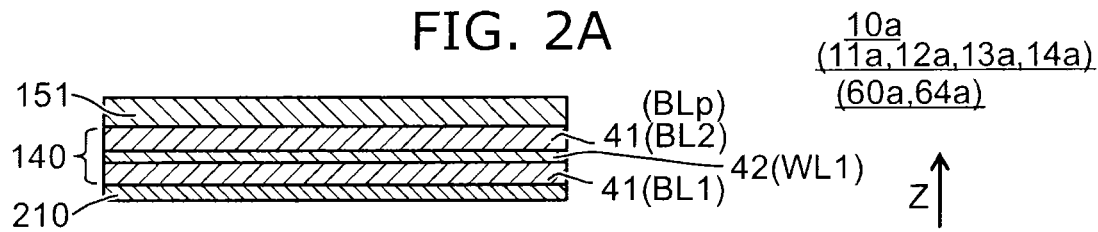
Figure 2C:
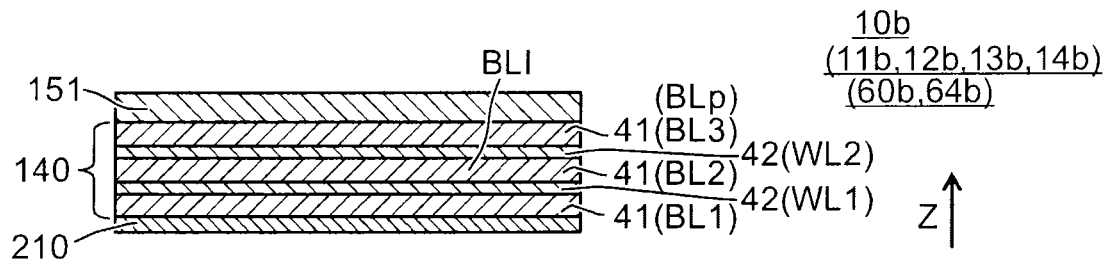
Figure 2D:
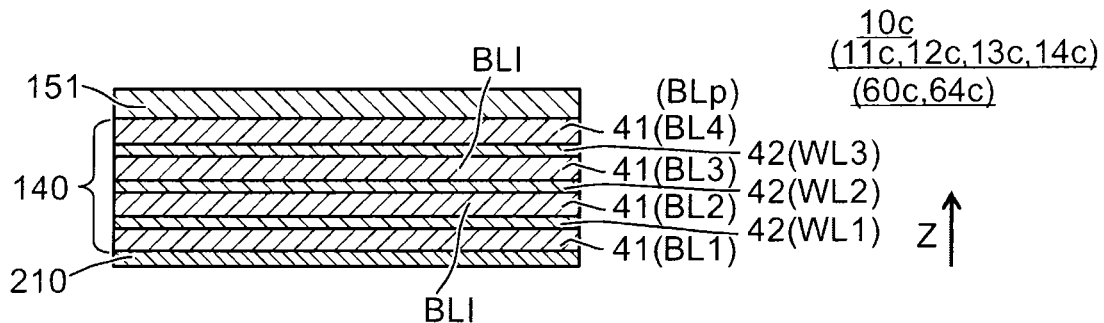

More specifically, FIG. 2A illustrates the configuration of the light emitting unit 140 in the semiconductor device 10 as well as semiconductor devices 11, 12, 13, and 14 and wafers 60 and 64 described later. FIG. 2B illustrates the configuration of the light emitting unit 140 in semiconductor devices 10a, 11a, 12a, 13a, and 14a and wafers 60a and 64a. FIG. 2C illustrates the configuration of the light emitting unit 140 in semiconductor devices 10b, 11b, 12b, 13b, and 14b and wafers 60b and 64b described later. FIG. 2D illustrates the configuration of the light emitting unit 140 in semiconductor devices 10c, 11c, 12c, 13c, and 14c and wafers 60c and 64c described later.

As shown in FIG. 2A, in the semiconductor device 10, the light emitting unit 140 includes a plurality of barrier layers 41 (e.g., first barrier layer BL1 and second barrier layer BL2) and a well layer 42. The well layer 42 is provided between the plurality of barrier layers 41.

For instance, the light emitting unit 140 can have a single quantum well (SQW) structure. In this case, the light emitting unit 140 includes two barrier layers 41 and a well layer 42 provided between the barrier layers 41. For instance, the light emitting unit 140 can have a multiple quantum well (MQW) structure. In this case, the light emitting unit 140 includes three or more barrier layers 41 and a well layer 42 provided between each pair of barrier layers 41.

In the example shown in FIG. 2A, the light emitting unit 140 includes n+1 barrier layers 41 and n well layers 42 (n is an integer of 1 or more). The (i+1)-th barrier layer BL(i+1) is placed between the i-th barrier layer BLi and the second layer 150 (i is an integer of 1 or more and n−1 or less). The (i+1)-th well layer WL(i+1) is placed between the i-th well layer WLi and the second layer 150. The first barrier layer BL1 is provided between the first layer 130 and the first well layer WL1 (i.e., between the first stacked body 210 and the first well layer WL1). The n-th well layer WLn is provided between the n-th barrier layer BLn and the (n+1)-th barrier layer BL(n+1). The (n+1)-th barrier layer BL(n+1) is provided between the n-th well layer WLn and the second layer 150.

As shown in FIG. 2B, in the semiconductor device 10a according to the embodiment, the light emitting unit 140 includes one well layer 42. As shown in FIG. 2C, in the semiconductor device 10b according to the embodiment, the light emitting unit 140 includes two well layers 42. As shown in FIG. 2D, in the semiconductor device 10c according to the embodiment, the light emitting unit 140 includes three well layers 42. The light emitting unit 140 may include four or more well layers 42.

Here, of the plurality of barrier layers 41, the barrier layer 41 nearest to the second layer 150 is referred to as p-side barrier layer BLp. Furthermore, in the case where a plurality of well layers 42 are provided, the barrier layer 41 provided between the plurality of well layers 42 is referred to as inter-well barrier layer BLI.

Of the plurality of barrier layers 41, the barrier layer 41 nearest to the first layer 130 is the first barrier layer BL1. Part of the first stacked body 210 may serve as this layer. In other words, of the plurality of third layers 203 of the first stacked body 210, the layer nearest to the light emitting unit 140 can serve as the first barrier layer BL1.

The first barrier layer BL1 includes e.g. $Al_{x1}Ga_{1-x1-y1}In_{y1}N$ ($0 \le x1 < 1$, $0 \le y1$, $0 < x1+y1 \le 1$). The first barrier layer BL1 is made of e.g. Si-doped n-type AlGaInN.

The second barrier layer BL2 (and the m-th barrier layer BLm, m being an integer of 2 or more) includes $Al_{x2}Ga_{1-x2-y2}In_{y2}N$ ($0 \le x2$, $y2 < 1$, $0 < x2+y2 \le 1$). Here, x2 may be equal to or different from x1. Furthermore, y2 may be equal to or different from y1. In particular, it is more preferable that $x2 < x1$. It is more preferable that $y1 < y2$.

The well layer 42 includes $Al_{x0}Ga_{1-x0-y0}In_{y0}N$ ($0 \le x0$, $0 < y0$, $x0+y0 < 1$, $y1 < y0$, $y2 < y0$). The well layer 42 includes $Ga_{1-y0}In_{y0}N$ ($0 < y0 \le 1$, $y1 < y0$, $y2 < y0$). Thus, the well layer 42 can include at least one of GaInN and AlGaInN.

The well layer 42 has a thickness (length along the Z-axis direction) of e.g. 2 nanometers (nm) or more and 9 nm or less.

The bandgap energy of the well layer 42 is smaller than the bandgap energy of the barrier layer 41. The bandgap energy of the well layer 42 is smaller than the bandgap energy in the first stacked body 210 and the bandgap energy in the second stacked body 220. This suppresses that the light emitted in the well layer 42 is absorbed in other semiconductor layers included in the semiconductor device 10. Thus, the light is extracted outside with high efficiency.

In the first stacked body 210, the thickness of the fourth layer 204 may be thinner than the thickness of the well layer 42. The third layer 203 may be thinner than the thickness of the second barrier layer BL2 (and the m-th barrier layer BLm, m being an integer of 2 or more).

The lower limit of the thickness of the fourth layer 204 is determined by the thickness such that the fourth layer 204 exhibits material properties of a continuous layer. The upper limit of the thickness of the fourth layer 204 is determined by the condition for providing a difference between the energy of the absorption edge in the fourth layer 204 and the energy of the absorption edge in the well layer 42.

That is, the thickness of the fourth layer 204 is e.g. a thickness of three atomic layers or more. The thickness of the fourth layer 204 is set less than or equal to the thickness such that the energy of the absorption edge in the fourth layer 204 is sufficiently larger than that of the absorption edge of the well layer 42. Specifically, the wavelength corresponding to the energy of the absorption edge of the fourth layer 204 is set on the short wavelength side of the wavelength at which the intensity of the emission spectrum of the well layer 42 falls below half the peak value. The thickness of the well layer 42 is e.g. a thickness of four atomic layers or more.

For instance, if the same composition is applied to the fourth layer 204 and the well layer 42, the fourth layer 204 can be grown under the same condition as the well layer 42. This simplifies the process. Furthermore, before growing the well layer 42, through the growth of the fourth layer 204, preparation under the same growth condition as the well layer 42 can be performed for a sufficient period of time. This can improve the controllability of the well layer 42. In this case, by making the thickness of the fourth layer 204 thinner than that of the well layer 42, the bandgap energy can be made larger than that of the well layer 42. Thus, absorption loss in the fourth layer 204 can be easily suppressed.

Alternatively, for instance, the fourth layer 204 can be made of GaInN having lower In concentration and larger bandgap energy than the well layer 42. This can reduce absorption of the light emission from the well layer 42 into the fourth layer 204. Furthermore, in this case, because of low absorption, the fourth layer 204 can be made thicker, and the number of pairs of the third layer 203 and the fourth layer 204 can be increased.

The thickness of the third layer 203 is e.g. a thickness of three atomic layers or more and 6 nm or less. The lower limit is the minimum thickness exhibiting characteristics similar to those of a continuous layer. The upper limit is the thickness at which the influence of overlap of wavefunctions penetrated from both sides remains and causes decrease of resistivity.

For instance, the Al composition of the third layer 203 is set similar (an Al concentration of approximately 10% or less) to that of the barrier layer 41 (e.g., first barrier layer BL1). This can reduce the resistance of barriers against electrons in relation to the GaN layer, and can achieve high quality crystal growth.

The third layer 203 is doped with Si. The concentration of Si in the third layer 203 is e.g. $1 \times 10^{17}$ cm$^{-3}$ or more and $2 \times 10^{19}$ cm$^{-3}$ or less. At less than $1 \times 10^{17}$ cm$^{-3}$, for instance, the electrical resistance is increased. Above $2 \times 10^{19}$ cm$^{-3}$, for instance, the crystallinity is decreased.

For instance, if the same composition is applied to the third layer 203 and the barrier layer 41 (e.g., first barrier layer BL1), the third layer 203 can be grown under the same condition as the barrier layer 41. This simplifies the process. Furthermore, before growing the barrier layer 41, through the growth of the third layer 203, preparation under the same growth condition as the barrier layer 41 can be performed for a sufficient period of time. This can improve the controllability of the barrier layer 41 (e.g., first barrier layer BL1).

For instance, the barrier layer 41 has the function of confining carriers in the well layer 42. Conversely, the third layer 203 is expected to have low resistance and to pass a current. Thus, by making the thickness of the third layer 203 thinner than the thickness of the barrier layer 41 to reduce the resistance, the resistance of the device can be effectively reduced without compromising the carrier confinement effect in the well layer 42.

In the second stacked body 220, the thickness of the sixth layer 206 may be thinner than the thickness of the well layer 42. The fifth layer 205 may be thinner than the thickness of the second barrier layer BL2 (and the m-th barrier layer BLm, m being an integer of 2 or more).

The thickness of the sixth layer 206 is e.g. a thickness of three atomic layers or more. The thickness of the sixth layer 206 is set less than or equal to the thickness such that the energy of the absorption edge in the sixth layer 206 is sufficiently larger than that of the absorption edge of the well layer 42. Specifically, the thickness of the sixth layer 206 is set so that the wavelength corresponding to the energy of the absorption edge of the sixth layer 206 is set on the short wavelength side of the wavelength at which the intensity of the emission spectrum of the well layer 42 falls below half the peak value. The relationship between the thickness of the sixth layer 206 and the thickness of the well layer 42 can be considered similarly to the relationship between the thickness of the fourth layer 204 and the thickness of the well layer 42. Thus, like the fourth layer 204, the thickness of the sixth layer 206 may be made thinner than that of the well layer 42. The thickness of the sixth layer 206 is e.g. 1 nm.

The thickness of the fifth layer 205 is e.g. a thickness of three atomic layers or more and 6 nm or less. The lower limit is the minimum thickness exhibiting characteristics similar to those of a continuous layer. The upper limit is the thickness at which the influence of overlap of wavefunctions penetrated from both sides remains and causes decrease of resistivity. The thickness of the fifth layer 205 is e.g. 2.5 nm.

The fifth layer 205 is doped with e.g. Si. The concentration of Si in the fifth layer 205 is e.g. $10 \times 10^{17}$ cm$^{-3}$ or more and $2 \times 10^{19}$ cm$^{-3}$ or less. At less than $10 \times 10^{17}$ cm$^{-3}$, for instance, the electrical resistance is increased. Above $2 \times 10^{19}$ cm$^{-3}$, for instance, the crystallinity is decreased. The Si concentration in the fifth layer 205 is e.g. $1.2 \times 10^{18}$ cm$^{-3}$.

The relationship between the thickness of the fifth layer 205 and the thickness of the barrier layer 41 can be considered similarly to the relationship between the thickness of the third layer 203 and the thickness of the barrier layer 41. Thus, like the third layer 203, the thickness of the fifth layer 205 may be made thinner than that of the barrier layer 41. The thickness of the fifth layer 205 is e.g. 2.5 nm.

The number of fifth layers 205 may be larger by one than the number of sixth layers 206. Alternatively, the number of fifth layers 205 may be smaller by one than the number of sixth layers 206.

In the case of growing the second stacked body 220 at low temperature in conformity with the sixth layer 206, growth at decreased temperature can be started from the sixth layer 206. If the number of sixth layers 206 is increased, the growth can be started from a flatter layer. This enables crystal growth with particularly high quality.

In the embodiment, the number of pairs of the third layer 203 and the fourth layer 204 in the first stacked body 210 may be equal to or different from the number of pairs of the fifth layer 205 and the sixth layer 206 in the second stacked body 220.

The corresponding emission wavelength of the first stacked body 210 is preferably 370 nm or more and 380 nm or less. The present inventors have experimentally confirmed by PL measurement that if the corresponding emission wavelength of the first stacked body 210 is 370 nm or more and 380 nm or less, and particularly 370 nm or more and 375 nm or less, then the light emitting unit 140 has high light emission efficiency. Based on this experimental result, it is considered that setting the corresponding emission wavelength of the first stacked body 210 to the wavelength range of 370 nm or more and 380 nm or less is desirable for device characteristics improvement. Here, the corresponding emission wavelength is described. The present inventors have confirmed that light emission from the first stacked body 210 can often be observed by PL measurement of the wafer used for the semiconductor device of the embodiment. The peak wavelength of this emission spectrum is defined as the corresponding emission wavelength of this semiconductor device.

In the following, example configurations of the above layers are illustrated. However, the embodiment is not limited thereto, but can be variously modified.

The thickness of the first buffer layer 121 is e.g. approximately 2 micrometers (μm). The thickness of the first AlN buffer layer 121a is e.g. 3 nm or more and 20 nm or less. The thickness of the second AlN buffer layer 121b is e.g. approximately 2 μm.

The thickness of the second buffer layer 122 is e.g. approximately 2 μm.

The Si concentration in the n-type contact layer 132 is e.g. $5 \times 10^{18}$ cm$^{-3}$ or more and $2 \times 10^{19}$ cm$^{-3}$ or less. The thickness of the n-type contact layer 132 is e.g. approximately 6 μm.

The n-type confinement layer 131 is made of e.g. Si-doped n-type GaN. The Si concentration in the n-type confinement layer is e.g. approximately $2 \times 10^{18}$ cm$^{-3}$. The thickness of the n-type confinement layer 131 is e.g. approximately 0.5 μm.

The p-type confinement layer 151 is made of e.g. Mg-doped p-type $Al_{0.15}Ga_{0.85}N$. The thickness of the p-type confinement layer 151 is e.g. approximately 24 nm. The Mg concentration on the light emitting unit 140 side of the p-type confinement layer 151 is set to e.g. approximately $3 \times 10^{19}$ cm$^{-3}$. The Mg concentration on the opposite side (in this example, on the p-side electrode 160 side) from the light emitting unit 140 of the p-type confinement layer 151 is set to e.g. $1 \times 10^{19}$ cm$^{-3}$.

The Mg concentration on the p-type confinement layer 151 side of the p-type contact layer 152 is set to e.g. approximately $1 \times 10^{19}$ cm$^{-3}$. The Mg concentration on the opposite side (in this example, on the p-side electrode 160 side) from the p-type confinement layer 151 of the p-type contact layer 152 is set to e.g. $2 \times 10^{19}$ cm$^{-3}$ or more and $20 \times 10^{19}$ cm$^{-3}$ or less.

The well layer 42 is made of e.g. GaInN as described above. The thickness of the well layer 42 is e.g. 2 nm or more and 9 nm or less. In particular, the thickness of 2.6 nm or more and 7 nm or less provides good light emission.

The light (emission light) emitted from the light emitting unit 140 is e.g. near ultraviolet light. The peak wavelength of the emission light is e.g. 380 nm or more and 400 nm or less. However, the embodiment is not limited thereto. The wavelength of the emission light is arbitrary. The peak wavelength of the emission light may be e.g. longer than 400 nm and 500 nm or less.

If the peak wavelength of the emission wavelength in the light emitting unit 140 is 380 nm or more, the influence of absorption by the first stacked body 210 as well as absorption by GaN with an absorption edge of 365 nm can be reduced. It is considered that setting the corresponding emission wavelength of the first stacked body 210 to the wavelength range of 370 nm or more and 380 nm or less is desirable for device characteristics improvement. Hence, the characteristics can be improved if the emission wavelength of the light emitting unit 140 is longer than 380 nm.

In the case where the peak wavelength of the emission wavelength in the light emitting unit 140 is 400 nm or less, the thickness of the well layer 42 is set to 4.5 nm or more and 9 nm or less. Then, for instance, good light emission is achieved. In the case where the peak wavelength of the emission wavelength in the light emitting unit 140 is 395 nm or less, the thickness of the well layer 42 is set to 4.5 nm or more and 7 nm or less. Then, good light emission is achieved. Furthermore, the controllability of emission wavelength and intensity was improved.

In the case where the peak wavelength of the emission wavelength in the light emitting unit 140 is 420 nm or more and 450 nm or less, the thickness of the well layer 42 is set to 3 nm or more and 4.5 nm or less. Then, high light emission efficiency can be achieved. In the case where the peak wavelength is 420 nm or more and 450 nm or less, by setting the thickness of the well layer 42 to 3.5 nm or more and 4 nm or less, the controllability of emission intensity was improved.

In a single quantum well structure in which the peak wavelength of the emission wavelength in the light emitting unit 140 is 430 nm or more and 470 nm or less, high light emission efficiency was achieved in the case where the thickness of the well layer 42 is 3 nm or more and 3.5 nm or less. In a multiple quantum well structure in which the peak wavelength of the emission wavelength is 430 nm or more and 470 nm or less, high light emission efficiency was achieved in the case where the thickness of the well layer 42 is 2.6 nm or more and 3 nm or less.

The peak wavelength of the emission light in the light emitting unit 140 can be set to e.g. 470 nm or more. Light emission was achieved in the well layer 42 having a thickness of 2 nm or more and 3.5 nm or less.

In the embodiment, a high quality base crystal can be obtained. Hence, the configuration of the embodiment is applicable to devices including an active layer having a longer wavelength (e.g., a wavelength in the 500-nm band, 600-nm band, 700-nm band, and furthermore, an arbitrary wavelength shorter than 0.75 eV, which is the absorption edge of InN). Furthermore, in the embodiment, in addition to the single quantum well structure and multiple quantum well structure, the light emitting unit 140 can have various configurations such as at least one of the DH structure (double heterostructure), piecewise quantum well structure, and quantum dot structure.

The well layer 42 is made of e.g. $Ga_{0.85}In_{0.15}N$. In this case, the thickness of the well layer 42 is set to e.g. approximately 3.3 nm. Then, the peak wavelength of light emitted from the light emitting unit 140 (well layer 42) is 400 nm or more and 450 nm or less. In the case where the number of well layers 42 is two, particularly high efficiency is achieved. The number of well layers 42 may also be three.

The first barrier layer BL1 is made of e.g. Si-doped n-type $Al_{0.065}Ga_{0.93}In_{0.005}N$. The Si concentration in the first barrier layer BL1 is set to e.g. $0.3 \times 10^{19}$ cm$^{-3}$ or more and $2 \times 10^{1-9}$ cm$^{-3}$ or less. The thickness of the first barrier layer BL1 is set to e.g. approximately 10 nm or more and 25 nm or less.

The second barrier layer BL2 (and the m-th barrier layer BLm, m being an integer of 2 or more) is made of e.g. GaInN. The thickness of the second barrier layer BL2 (and the m-th barrier layer BLm, m being an integer of 2 or more) is set to e.g. approximately 6 nm.

Alternatively, the second barrier layer BL2 (and the m-th barrier layer BLm, m being an integer of 2 or more) is made of e.g. GaN.

In the case where a plurality of well layers 42 are provided, the interwell barrier layer BLI is made of e.g. GaInN. The bandgap energy of the interwell barrier layer BLI is preferably set to less than or equal to the bandgap energy of the first barrier layer BL1 and less than or equal to the bandgap energy of the p-side barrier layer BLp.

The second barrier layer BL2 (and the m-th barrier layer BLm, m being an integer of 2 or more) is made of e.g. $Ga_{0.93}In_{0.07}N$. The thickness of the second barrier layer BL2 (and the m-th barrier layer BLm, m being an integer of 2 or more) is e.g. larger than 2 nm and less than 9 nm. More preferably, the thickness of the second barrier layer BL2 (and the m-th barrier layer BLm, m being an integer of 2 or more) is larger than 2 nm and less than 5 nm.

To form a deep potential for efficiently generating ultraviolet light emission with an emission wavelength of 380 nm or more and 400 nm or less, the Al composition in the first barrier layer BL1 and the i-th barrier layer BLi ($1<i \leq n$) may be set to 6% or more.

The thickness of the barrier layer 41 is set to 2 nm or more. If the thickness of the barrier layer 41 (p-side barrier layer BLp) nearest to the second layer 150 of p-type AlGaN is thinner than 2 nm, then in the process for increasing the growth temperature to grow the p-type AlGaN layer, the well layers 42 such as the n-th well layer WLn undergo thermal degradation. To control the characteristics of the well layer 42 including the influence of impurity diffusion, the thickness of the p-side barrier layer BLp is set to 4.5 nm or more. In particular, if the thickness of the p-side barrier layer BLp is thicker than the thickness of the well layer 42, there is a significant effect of relaxing the influence of strain between the p-type AlGaN layer and the well layer 42.

If the p-side barrier layer BLp is too thick, this causes the increase of device resistance. If the barrier layers 41 other than the first barrier layer BL1 are too thick, this causes the increase of device resistance. Furthermore, carriers overflowing the well layer 42 are accumulated and cause absorption. Conversely, if the barrier layers 41 other than the p-side barrier layer BLp are too thin, the carrier confinement to the well layer 42 is weakened, and the light emission efficiency is decreased. To reduce this influence, the barrier layers 41 other than the first barrier layer BL1 are preferably made thinner than the first barrier layer BL1. In particular, in a semiconductor device with the thickness of the p-side barrier layer BLp set to 4 nm or more and 9 nm or less, the device can be operated with a voltage increase of 10% or less of the operating voltage anticipated from the emission wavelength. In a device with the thickness of the barrier layers 41 other than the first barrier layer BL1 and the p-side barrier layer BLp set to 4 nm or more and 15 nm or less, light emission characteristics with high efficiency were achieved.

The thickness of the first barrier layer BL1 can be set to a value in the range of e.g. 4.5 nm or more and 30 nm or less. If the thickness of the first barrier layer BL1 is set to 4.5 nm or more, the intrinsic material properties are developed, and the effect of suppressing hole overflow is achieved. Furthermore, in the case where the thickness of the first barrier layer BL1 is 30 nm or less, high quality crystal growth can be performed relatively easily.

The thickness of the first to n-th barrier layers BL1-BLn is preferably thicker than that of the well layer 42. By setting the thickness of the first barrier layer BL1 to be thicker than the thickness of the well layer 42, carrier supply to the well layer 42 is effectively controlled. In particular, the thickness of the first to n-th barrier layers BL1-BLn is preferably twice or more the thickness of the well layer 42. Setting the thickness of the first to n-th barrier layers BL1-BLn to twice or more the thickness of the well layer 42 enables carrier supply to both sides of the first to (n−1)-th barrier layers BL1-BL(n−1). This improves the accuracy of carrier supply to the well layer 42.

To efficiently inject holes from the second layer 150 of p-type AlGaN into the n-th well layer WLn, the thickness of the p-side barrier layer BLp is preferably thin except for the aforementioned condition. Thus, the thickness of the p-side barrier layer BLp may be thinner than that of the third layer 203 of the first stacked body 210 and the fourth layer 204 of the second stacked body 220.

The first barrier layer BL1 suppresses that, for instance, holes injected into each well layer 42 of the light emitting unit 140 flow out to the first layer 130 side. To achieve the effect of potential block against carriers, particularly including the case where there are crystal defects and the like, the thickness of the first barrier layer BL1 is made sufficiently thick. If the thickness of the first barrier layer BL1 is approximately 15 nm or more and 20 nm or less, a sufficient effect is achieved. When the thickness of the first barrier layer BL1 was thinner than 13 nm, decrease of yield ratio was sometimes observed. That is the increase of the ratio devices with large efficiency droop at high injection current density. When the thickness of the first barrier layer BL1 was thicker than 22 nm, an increase was sometimes observed in the proportion of devices with high resistance.

The third layer 203 of the first stacked body 210 and the fifth layer 205 of the second stacked body 220 are located on the opposite side of the first barrier layer BL1 from the light emitting unit 140. Hence, the third layer 203 and the fifth layer 205 play a less significant role than the first barrier layer BL1 in suppressing the leakage of holes from the light emitting unit 140. On the other hand, the third layers 203 and the fifth layers 205 are provided in a plurality, and hence are likely to act as resistance of current. Thus, to decrease the driving voltage of the device, it is preferable to make the third layer 203 and the fifth layer 205 as thin as possible. Hence, the thickness of the third layer 203 and the fifth layer 205 is preferably thinner than the thickness of the first barrier layer BL1.

The thickness of the third layer 203 and the fifth layer 205 is preferably thin to reduce electrical resistance. Thus, the bandgap of the first barrier layer BL1 is made larger than that of these layers to increase the electrical resistance to reduce the hall leakage of the first barrier layer BL1. The relationship of the thickness of the first barrier layer BL1, the thickness of the third layer 203, and the thickness of the fifth layer 205 is the relationship of effective thickness in terms of electrical resistance. For instance, at least the effective thickness of the first barrier layer BL1 is set larger than or equal to the effective thickness of the third layer 203 and the effective thickness of the fifth layer 205. This improves the device characteristics.

The first barrier layer BL1 can be doped with Si at high concentration to reduce the influence of the piezoelectric field applied to the well layer 42. Thus, light emission with high efficiency can be achieved.

With regard to the relationship among the well layer 42 of the light emitting unit 140, the GaInN layer of the fourth layer 204 of the first stacked body 210, and the GaInN layer of the sixth layer 206 of the second stacked body 220, the thickness of the GaInN layer is preferably thinner than the thickness of the well layer 42. Then, the optical bandgap energy of the well layer 42 is made smaller than the optical bandgap energy of GaInN of the fourth layer 204 and GaInN of the sixth layer 206. This suppresses that the light emission of the well layer 42 is absorbed by at least one of GaInN of the fourth layer 204 and GaInN of the sixth layer 206. The relationship in thickness among the well layer 42, GaInN of the fourth layer 204, and GaInN of the sixth layer 206 can be specified by effective thickness in terms of each optical bandgap energy. The effective thickness of GaInN of the fourth layer 204 and the effective thickness of GaInN of the sixth layer 206 are preferably thinner than the effective thickness of the well layer 42.

In the thin film structure, the bandgap energy can be significantly varied simply by varying the composition to fabricate a crystal in which the thinner layer has smaller bandgap energy than the thicker layer. However, this causes a large difference in the In concentration of GaInN, and also causes a large difference in material properties. Thus, high quality crystal growth is difficult in this case. Thus, it is more preferable that, the thickness of GaInN of the fourth layer 204 and the thickness of GaInN of the sixth layer 206 be thinner than the thickness of the well layer 42.

If the Al concentration in the first barrier layer BL1 and the i-th barrier layer BLi ($1<i\leq n+1$) exceeds 10%, the crystal quality is degraded. By doping the first barrier layer BL1 and the i-th barrier layer BLi with a small amount of In, for instance, the crystal quality can be improved. By setting the In concentration in the first barrier layer BL1 and the i-th barrier layer BLi to 0.3% or more, improvement in crystal quality is observed. However, if the In concentration exceeds 1.0%, the crystal quality is degraded, and the light emission efficiency is decreased. However, in the case where the thickness of the first barrier layer BL1 and the i-th barrier layer BLi is thin, the In concentration can be increased to 2%.

The fifth layer 205 of the second stacked body 220 is made of e.g. a GaN layer having a thickness of 2.5 nm. The sixth layer 206 is made of e.g. a $Ga_{0.93}In_{0.07}N$ layer of 1 nm. The number of stacked layers (the number of pairs) of the fifth layers 205 and sixth layers 206 is e.g. 16. Here, for instance, the number of fifth layers 205 may be set to 17, with the number of sixth layers 206 set to 16.

The third layer 203 of the first stacked body 210 is made of e.g. an $Al_{0.07}Ga_{0.93}In_{0.01}N$ layer having a thickness of 2 nm. The fourth layer 204 is made of e.g. a $Ga_{0.93}In_{0.07}N$ layer of 1 nm. The number of stacked layers (the number of pairs) of the third layers 203 and fourth layers 204 is e.g. 30.

As described later, an intermediate layer may be provided between the first stacked body 210 and the second stacked body 220.

Figure 3:
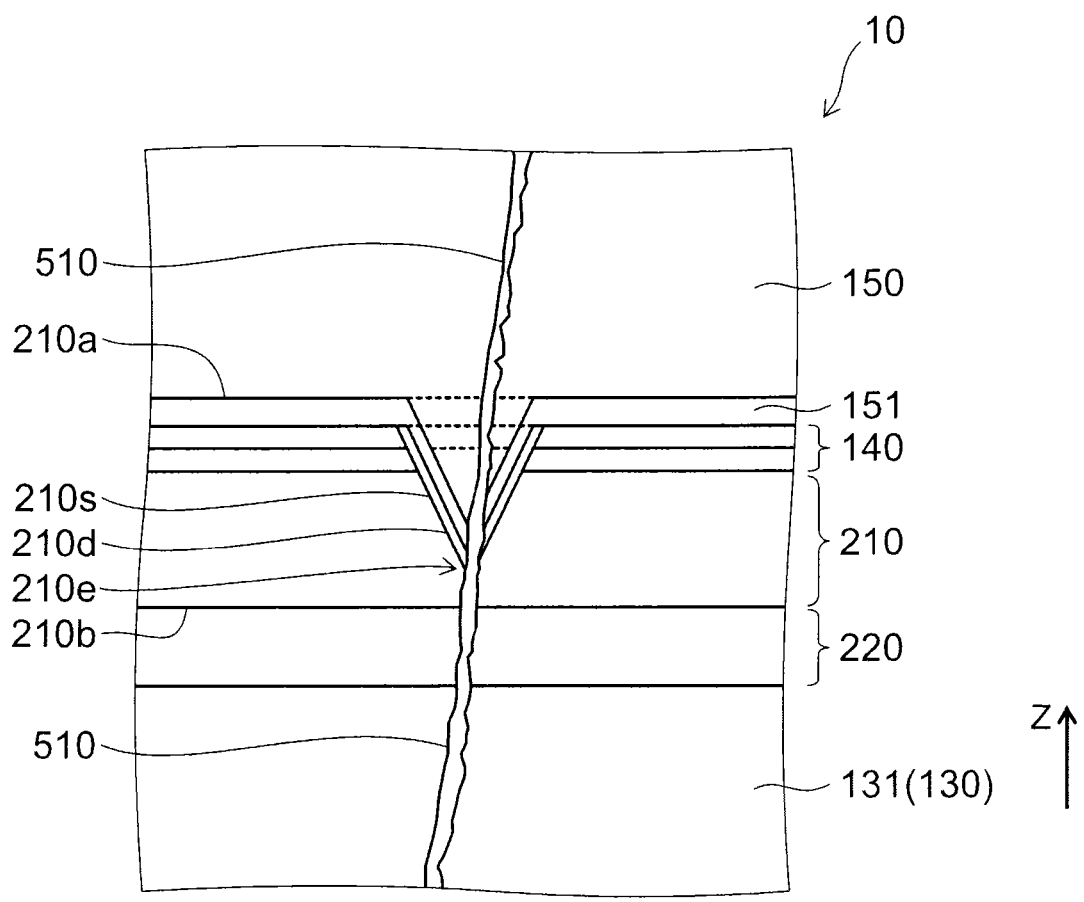
FIG. 3 is a schematic sectional view illustrating the semiconductor device according to the first embodiment.

FIG. 3 is a schematic sectional view illustrating the configuration of the semiconductor device according to the first embodiment. As shown in FIG. 3, in the semiconductor device 10 according to the embodiment, the first stacked body 210 has a depression 210d. The depression 210d is provided in the surface 210a on the light emitting unit 140 side of the first stacked body 210. That is, the first stacked body 210 has the surface 210a (a first surface). The first surface faces the light emitting unit 140a. The depression 210d is provided in the first surface. The depression 210d is set back along the direction from the second layer 150 toward the first layer 130 (−Z-axis direction). Part of the light emitting unit 140 is embedded in at least part of the depression 210d.

Thus, the embodiment provides a semiconductor device having high efficiency.

Furthermore, part of the second layer 150 is placed on the part of the light emitting unit 140 embedded in the at least part of the depression 210d. Furthermore, part of the second layer 150 may be embedded in (the remaining space of) at least part of the depression 210d.

Furthermore, for instance, the depression 210d does not penetrate through the first stacked body 210 along the Z-axis direction. That is, the tip 210e of the depression 210d is located in the first stacked body 210. The tip 210e of the depression 210d is located between the surface 210b on the first layer 130 side of the first stacked body 210 and the surface 210a on the light emitting unit 140 side of the first stacked body 210.

Furthermore, as illustrated in FIG. 3, a dislocation 510 penetrating through the first layer 130, the first stacked body 210, the light emitting unit 140, and the second layer 150 is formed. The side surface 210s of the depression 210d surrounds the dislocation 510.

For instance, the side surface 210s of the depression 210d is substantially symmetric (such as circularly symmetric, 3-fold symmetric, and 6-fold symmetric) about the extension axis of the dislocation 510. For instance, the dislocation 510 is substantially parallel to the Z-axis direction. The term "substantially symmetric" includes incomplete but generally symmetric structures.

By such configuration, the semiconductor device 10 achieves high efficiency.

The present inventors have constructed the configuration of a semiconductor device capable of emitting light with high efficiency based on the experimental results and considerations described below.

In a configuration of a semiconductor device based on nitride semiconductors, a stacked body with a plurality of GaInN layers stacked therein is provided between the sapphire substrate and the light emitting unit 140 including a well layer 42 of GaInN. The present inventors formed a stacked body (corresponding to the second stacked body 220) by alternately stacking a plurality of GaN layers and a plurality of GaInN layers. Then, the present inventors performed experiments for forming a semiconductor device by forming a light emitting unit 140 including a well layer 42 of GaInN on the stacked body. Thus, the present inventors investigated the relationship between the number of stacked layers in the stacked body and the surface flatness of the semiconductor device. As a result, by providing a stacked body in which GaN layers and GaInN layers are alternately and repetitively stacked, the surface flatness is improved. However, the present inventors have found that if the number of stacked layers is increased, there are cases where the surface flatness is conversely compromised.

Furthermore, a stacked body (corresponding to the first stacked body 210) with a plurality of AlGaInN layers and a plurality of GaInN layers alternately stacked therein was interposed between the second stacked body 220 and the light emitting unit 140. Then, the present inventors have found that in this configuration, there are cases where the number of GaInN layers maintaining high surface flatness is increased.

The thickness of the GaInN layer of the well layer 42 is several nm. It is considered that the improved surface flatness reduces the influence of unevenness on the GaInN layer of the light emitting unit 140 and can increase the light emission efficiency.

In the case of forming the first stacked body 210 (in which AlGaInN layers and GaInN layers are stacked) on the second stacked body 220 (in which GaN layers and GaInN layers are stacked), when the number of AlGaInN layers and GaInN layers is varied, the dependence of the flatness of the crystal surface on the number of layers behaves similarly to the dependence of the flatness on the number of layers in the case of providing only the second stacked body 220. However, in the case of combining AlGaInN layers and GaInN layers, even for a larger number of layers, the flatness of the crystal surface was improved compared with the case of lacking the structure of the combination of AlGaInN layers and GaInN layers. In this case, the sharp degradation of flatness as in the stacked structure of GaInN layers and GaN layers did not occur. Furthermore, in the case of providing the first stacked body 210 on the second stacked body 220, the range of the number of layers with improved flatness was wider than the range of the number of layers with improved flatness in the case of providing only the second stacked body 220. That is, it is found that the combination of AlGaInN layers and GaInN layers is particularly effective for flatness improvement.

That is, the flatness of the crystal surface can be improved in a wider range of the number of layers by combining the first stacked body 210 including a plurality of stacked AlGaInN layers and GaInN layers, and the second stacked body 220 including a plurality of stacked GaN layers and GaInN layers.

For instance, the thickness of the AlGaInN layer was set to 2.5 nm, and the thickness of the GaInN layer was set to 1 nm. In this case, when the number of AlGaInN layers and the number of GaInN layers were each 3 or more and 25 or less, the flatness was improved. That is, if the total thickness of GaInN layers is set to 3 nm or more and 25 nm or less, the flatness is improved, and the light emission efficiency can be improved.

Combining the first stacked body 210 and the second stacked body 220 expands the range of the total thickness of the GaInN layers capable of improving the flatness of the crystal surface. Thus, in the range of 3 nm or more and 50 nm or less, there are cases where the flatness can be improved.

The present inventors have found that in the first stacked body 210, the stacking rate around the dislocation 510 (threading dislocation) is slowed down to form a depression structure (depression 210*d*). This depression 210*d* is filled with e.g. AlGaN (e.g., first barrier layer BL1). Then, the depression 210*d* around the dislocation 510 is filled with that AlGaN layer and the region where AlGaInN layers and GaInN layers thinner than those formed on the flat portion are stacked.

If the effective bandgap energy in the region where AlGaInN layers and GaInN layers thinner than those formed on the flat portion are stacked is larger than the bandgap energy of GaInN of the well layer 42, then dissipation of the injected current around the dislocation 510 without effectively contributing to light emission in the well layer 42 of GaInN is suppressed.

Furthermore, in the case where the light emitting unit 140 includes a plurality of well layers 42 and an interwell barrier layer BLI, it is considered that the aforementioned effect is further enhanced if the effective bandgap energy in the region where AlGaInN layers and GaInN layers thinner than those formed on the flat portion are stacked is larger than the bandgap energy of the interwell barrier layer BLI.

For instance, preferably, the tip 210*e* of the depression 210*d* occurring around the threading dislocation is formed in the first stacked body 210 so that a mixed region of AlGaInN layers and GaInN layers is formed around the threading dislocation. The bandgap energy in the region where AlGaInN layers and GaInN layers thinner than those formed on the flat portion are stacked is larger than the bandgap energy of stacked GaN layers and GaInN layers. By the formation of such a region with large bandgap energy, for instance, the aforementioned effect is efficiently achieved.

In the following, the embodiment is described in more detail. If GaN, InN, AlN, and a mixed crystal thereof are formed on the depressed surface and made thinner than on the flat portion, then it is considered that In, Ga, and Al, in the increasing order of coupling to N, are more easily separated in this order from the crystal and contribute more significantly to thinning. Thus, in the slope filling the depression 210*d*, it is considered that the Al composition tends to increase, and the In composition tends to decrease. In GaInN, in terms of composition as well as in terms of thickness in view of the quantum effect, it is considered that the bandgap energy tends to increase. In AlGaInN, it is considered that the bandgap energy tends to increase in terms of composition. In this case, particularly in the stacked structure of AlGaInN and GaInN, the bandgap energy is increased. It is considered that the thinned stacked structure formed around the dislocation has a significant effect of suppressing the flow of current in the dislocation and significantly contributes to increasing the (optical) output of the light emitting device.

Thus, the semiconductor device 10 according to the embodiment provides a semiconductor device having high efficiency.

Furthermore, it is found that the characteristics of the semiconductor device, and particularly the characteristics of the electrical junction, can be improved by providing the first stacked body 210 between the second stacked body 220 and the light emitting unit 140.

The second stacked body 220 includes GaN layers and GaInN layers. The second stacked body 220 has e.g. a superlattice structure. The lattice mismatch between the GaN layer and the GaInN layer is large, and the growth rate around the dislocation 510 is slow. Hence, a recess is formed around the dislocation 510. At the center of the recess, for instance, the dislocation 510 exists. In this case, a strain is applied thereto by the stacking of the superlattice structure. Thus, the dislocation 510 is gradually bent and directed along a direction generally perpendicular to the layers (Z-axis direction).

The present inventors observed this state by cross-sectional TEM.

FIG. 3 is depicted based on the cross-sectional TEM image.

The opening of the recess depends on the direction of the dislocation 510. In the oblique portion of the dislocation 510, the opening of the recess is wide. As the dislocation 510 becomes vertical (parallel to the Z-axis direction), the opening of the recess becomes smaller. This causes the slope (side surface) of the recess to be formed from a surface stable in terms of energy. It is considered that this results in decreasing the growth rate, decreasing the In incorporation efficiency, and enhancing the symmetry of the side surface of the recess. That is, in the portion where the opening of the recess is narrow, In is not easily incorporated.

Thus, the In average concentration is high in the first portion (the portion on the first layer 130 side) of the second stacked body 220. As the second stacked body 220 grows and narrows the opening, the In average concentration is gradually decreased. It is considered that when the shape of the depression 210*d* is stabilized, the In average concentration becomes constant.

Such a crystal can be realized by forming a superlattice structure of GaN and GaInN with appropriate adjustment. Primarily, the thickness and period are adjusted. For instance, the thickness of the GaN layer is e.g. 2.5 nm. The thickness of the GaInN layer is e.g. 1 nm. The In concentration is approximately 0.5%. The period (the number of GaN layers and the number of GaInN layers) is 16.

The recess generated in the second stacked body 220 is taken over to the first stacked body 210 (AlGaInN layers and GaInN layers) and the light emitting unit 140 while maintaining the shape with the dislocation 510 directed in the vertical direction. The recess extends toward the surface with the substantially vertical direction left unchanged. The shape of the recess (depression 210d) has a generally rotationally symmetric structure opening toward the surface (to the direction from the first layer 130 toward the second layer 150). For instance, the recess is shaped like a circular cone, hexagonal pyramid, or trigonal pyramid. The axis of rotational symmetry is generally directed along the dislocation 510.

The depression 210d formed in the first stacked body 210 is filled with part of the light emitting unit 140. For instance, it is observed in the cross-sectional TEM image that the well layer 42 (InGaN layer) and the barrier layer 41 (AlGaInN layer) are stacked symmetrically with respect to the dislocation 510 coinciding with the central axis of the depression 210d.

The thickness of the first stacked body 210 is thicker than the depth of the depression 210d formed in the first stacked body 210. If the depression 210d penetrates through the first stacked body 210, for instance, this causes leakage of carriers. To suppress this, the configuration (primarily the thickness and period) of the first stacked body 210 is appropriately designed. For instance, the thickness of the AlGaInN layer is e.g. 2 nm. The thickness of the GaInN layer is e.g. 1 nm. The period (the number of AlGaInN layers and the number of GaInN layers) is e.g. 30.

If the dislocation 510 penetrating through the light emitting unit 140 is directed vertically, the proportion of the area of the portion disturbed by the dislocation 510 to the area of the light emitting unit 140 is decreased. This increases the light emission efficiency. Furthermore, if the dislocation 510 is directed vertically, the current becomes less likely to flow therein, and the leakage of current is suppressed. Moreover, the In concentration around the dislocation 510 is decreased. Thus, the bandgap energy around the dislocation 510 is increased. This suppresses lateral current toward the dislocation 510 and reduces the leakage current. Furthermore, the relative area ratio of the region where the crystal around the dislocation 510 is disturbed is decreased. This improves the quality of the second layer 150 grown on the light emitting unit 140. Furthermore, the manufacturing yield is improved.

In forming the stacked body, if the growth rate is slowed down, the incorporation efficiency of Al (strongly coupled to nitrogen) into the crystal surface is made higher than the incorporation efficiency of In (weakly coupled to nitrogen) and Ga (moderately coupled to nitrogen) into the crystal surface. Thus, by using the first stacked body 210 based on AlGaInN layers and GaInN layers, a region with high Al composition is formed more easily around the dislocation 510. This suppresses current flow into the dislocation 510 and suppresses leakage current.

In a layer with high Al concentration, the direction of the dislocation 510 is easily changed from vertical. It is considered that the shape of the depression 210d is stabilized by supplying In, which is weakly coupled to nitrogen and facilitates the motion of atoms at the crystal surface, during the formation of the AlGaInN layer.

Furthermore, by repetitively forming thin AlGaInN layers and thin GaInN layers, the GaInN layer having high In concentration and easily assuming a thermodynamically stable state is formed before the shape of the depression 210d is significantly varied during the formation of the AlGaInN layer. It is considered that this stabilizes the shape of the depression 210d.

Thus, by providing a first stacked body 210 in which a plurality of AlGaInN layers and a plurality of GaInN layers are alternately stacked, the dislocation 510 is formed vertically in the light emitting unit 140. This improves the efficiency.

The present inventors have also found that the configuration of the semiconductor device 10 according to the embodiment improves the flatness of the crystal surface. By combining the second stacked body 220 and the first stacked body 210, a crystal with high surface flatness can be formed. Thus, in this configuration, by increasing the number of GaInN layers, the depression 210d can be efficiently formed in the first stacked body 210, and a flat well layer 42 can be formed.

As described above, in the first stacked body 210, the stacking rate around the threading dislocation (dislocation 510) is slowed down to form a depression 210d. The depression 210d is filled with part of the light emitting unit 140 and part of the second layer 150. Thus, a region with large bandgap energy where AlGaInN layers and GaInN layers thinner than those formed on the flat portion are stacked is formed around the dislocation 510. This suppresses current leakage to the neighborhood of the dislocation, and suppresses the efficiency decrease of the semiconductor device. Thus, light emission with high efficiency is achieved.

In the embodiment, in the case of providing a plurality of well layers 42, more uniform carrier injection is achieved if the bandgap energy of the barrier layer 41 between the well layers 42 is made smaller than the bandgap energy of the first barrier layer BL1 (e.g., AlGaInN).

In the embodiment, the bandgap energy of the well layer 42 is smaller than the bandgap energy of the other layers (e.g., first barrier layer BL1, GaN-containing layers, AlGaN-containing layers, first stacked body 210, and second stacked body 220). This suppresses absorption of light emission of the well layer 42 into the other layers. Furthermore, because the well layer 42 has small unevenness, the absorption edge energy of the well layer 42 has small fluctuation. This reduces the effect in which light emission in one region of the well layer 42 is absorbed in another region of the well layer 42 where the absorption edge energy is small. Furthermore, in the case where the number of well layers 42 is made small (e.g., 1, 2, or 3), absorption of light by other layers is suppressed, which would occur in the case of many (e.g., four or more) well layers 42 having different carrier distributions and hence different light emission states. By these effects, emission light is efficiently extracted outside.

In the semiconductor device 10 according to the embodiment, for instance, the number of well layers 42 is set to 1 or more and 3 or less. This prevents nonuniformity of carriers which would occur in the case of providing many well layers 42. Furthermore, because the number of well layers 42 is small, a uniform well layer 42 can be formed under the optimal fabrication condition. As a result, the light emission efficiency in the well layer 42 can be increased. Furthermore, absorption in the well layer, which would occur in the case of many well layers 42, is small. Hence, the light extraction efficiency can also be increased.

For instance, in the case of one well layer 42, electrons and holes are injected into the same well layer 42. This increases the light emission efficiency. Furthermore, because there is no other well layer, there is no problem with the distribution of injection carrier density among the well layers by which light emission is absorbed by the well layer having low injection carrier density to decrease the overall light emission efficiency.

In the case of two well layers 42, a well layer 42 with high injection efficiency is provided on the injection region side, and a well layer 42 with high accumulation efficiency is provided on the pn junction side. This configuration is less likely to produce a well layer 42 having low light emission efficiency and a significant effect as an absorber, as in the case of providing many (e.g., four or more) well layers 42.

In the case of three well layers 42, as a structure including a plurality of well layers 42, the simplest structure symmetric with respect to electron injection and hole injection is produced. This configuration is less likely to produce a well layer 42 having low light emission efficiency and a significant effect as an absorber, which is likely to occur in the case of providing many, such as eight or more, well layers 42.

In the semiconductor device 10 according to the embodiment, in the case where the number of well layers 42 is set to four or more, even if the current injection density per area is increased, the carrier injection density per state density is not easily increased. Hence, a high output semiconductor device driven by large current can be easily realized.

In a semiconductor device emitting blue light (the peak wavelength of light emission is e.g. 450 nm or more and 480 nm or less), the In concentration in the well layer 42 is high. Hence, if a well layer 42 having a thickness of 4.5 nm or more is formed, the strain due to lattice mismatch between the GaN layer and the well layer 42 is too large. Thus, the crystal quality is degraded, and the light emission intensity is decreased. On the other hand, if the thickness of the well layer 42 is thin, confinement of carriers to the well layer 42 is weak. Thus, in the SQW structure, it is difficult to achieve high light emission efficiency. Consequently, the MQW structure is adopted.

In the embodiment, in the case of providing a plurality of well layers 42, the bandgap energy of the interwell barrier layer BLI may be set smaller than the bandgap energy of AlGaInN of the first barrier layer BL1. Thus, holes are uniformly injected into the well layer 42, and high light emission efficiency can be achieved. Furthermore, in the case of using the first barrier layer BL1 like this, the first barrier layer BL1 has at least one of higher Al concentration and lower In concentration than the interwell barrier layer BLI. Thus, the lattice constant of the first barrier layer BL1 is smaller than the lattice constant of the interwell barrier layer BLI. Hence, the strain of the light emitting unit 140 having high In concentration and large lattice strain is relaxed by the first barrier layer BL1 adjacent thereto. Thus, even in the case of using a high In concentration, a good crystal is obtained.

If the bandgap energy of the p-side barrier layer BLp is made higher than the bandgap energy of the interwell barrier layer BLI, high energy holes can be injected into the light emitting unit 140. This can suppress nonuniformity of the hole concentration distribution between the plurality of well layers 42. Thus, the light emission efficiency can be further increased.

Thus, the semiconductor device 10 according to the embodiment provides a semiconductor device having high efficiency.

In the embodiment, by setting the thickness of the well layer 42 to 2 nm or more and 9 nm or less, high light emission efficiency and good spectrum characteristics are achieved.

In the case where the well layer 42 is made of e.g. $Ga_{0.93}In_{0.07}N$, high light emission efficiency is achieved by setting the thickness of the well layer 42 to 4.5 nm or more and 9 nm or less.

According to the present inventors investigation, in the case where the thickness of the well layer 42 is thinner than 4.5 nm, the light emission intensity is significantly low. The thickness larger than 9 nm results in broadening of the light emission spectrum and significant decrease of the light emission intensity.

In the case where the thickness of the well layer 42 is thinner than 2 nm, spreading of carriers from the well layer 42 to the barrier layer (e.g., at least one of the first barrier layer BL1, the interwell barrier layer BLI, and the p-side barrier layer BLp) is increased. It is considered that this causes the efficiency decrease. If the thickness of the well layer 42 exceeds 9 nm, the lattice mismatch between the GaN layer (such as the second buffer layer 122, the n-type contact layer 132, and the n-type confinement layer 131) and the well layer 42 is increased, and the strain applied to the crystal becomes too large. It is presumed that this decreases the crystal quality.

In particular, in the case where the thickness of the well layer 42 is 3 nm or more and 4.5 nm or less, by increasing the number of well layers 42, the light emission intensity was successfully made equal to or higher than that of the configuration of a single well layer 42. On the other hand, if the thickness of the well layer 42 is set to 7 nm or more, the emission wavelength is significantly restricted, and it is difficult to fabricate a well layer 42 with a wavelength longer than 450 nm. If the thickness of the well layer 42 is 7 nm or less, spectrum broadening does not substantially occur. Thus, even in the case where there are fluctuations in the shape and composition of the crystal, it is presumed that no strain-induced degradation in crystallinity occurs substantially in the entire region (e.g., the entire region of the well layer 42).

The light (emission light) emitted from the light emitting unit 140 is not limited to this wavelength. The wavelength can be set to various values as in the above description of the embodiment. The light emitting unit 140 can be variously configured as in the above description of the embodiment.

In the semiconductor device 10 according to the embodiment, decreasing the number of wells can solve the problems of carrier nonuniformity and reabsorption in many well layers 42 as described above. Furthermore, as a result of further investigation on the configuration of the semiconductor device 10 according to the embodiment, it has been found that in addition to the aforementioned effect, there is an additional effect of increasing the light emission efficiency in terms of crystal quality. That is, in the embodiment, by decreasing the number of well layers 42, each layer can be optimized so as to maximize the crystal quality of the well layer 42. Conversely, in a structure with many well layers 42 stacked therein, many well layers 42 with high strain are stacked to grow a crystal. This causes accumulation of strain with the growth. Thus, it is difficult to perform crystal growth of all the well layers 42 under the same growth condition. Hence, the crystal characteristics are varied for each well layer 42.

In the following, an example method for manufacturing the semiconductor device 10 according to the embodiment is described.

For instance, by using the metal organic chemical vapor deposition method, on a substrate 110 having a surface made of a sapphire c-plane, an AlN layer is formed as a first buffer layer 121 with a thickness of approximately 2 μm. Specifically, a first AlN buffer layer 121a of high carbon concentration (the carbon concentration is e.g. $3\times10^{18}$ $cm^{-3}$ or more and $5\times10^{20}$ $cm^{-3}$ or less) is formed with 3 nm or more and 20 nm or less. Further thereon, a second AlN buffer layer 121b of high purity (the carbon concentration is $1\times10^{16}$ $cm^{-3}$ or more and $3\times10^{18}$ $cm^{-3}$ or less) is formed with 2 μm. Then, further thereon, a non-doped GaN layer is formed as a second buffer layer 122 (lattice relaxation layer) with a thickness of 2 μm.

Then, a Si-doped n-type GaN layer with a Si concentration of $5\times10^{18}$ $cm^{-3}$ or more and $2\times10^{19}$ $cm^{-3}$ or less is formed as an n-type contact layer 132 with a thickness of 6 μm. Furthermore, a Si-doped n-type GaN layer with a Si concentration of $2×10^{18}$ cm$^{-3}$ is formed as an n-type confinement layer 131 with a thickness of 0.5 μm. More preferably, the Si concentration in the n-type contact layer 132 is set to $1×10^{19}$ cm$^{-3}$ or more and $2×10^{19}$ cm$^{-3}$ or less.

Further thereon, a second stacked body 220 is formed. For instance, GaN layers of 2.5 nm and GaInN layers of 1 nm are alternately stacked. The thickness of the GaN layer is larger than or equal to the thickness of the GaInN layer. Preferably, the thickness of the GaN layer is 7 nm or less. More preferably, the thickness of the GaN layer is 3 nm or less. The thickness of the GaInN layer is thinner than that of the well layer 42. The GaN layer is doped with e.g. Si. In the second stacked body 220, the number of GaN layers and the number of GaInN layers are 12 or more and 20 or less. If the number is less than 12, for instance, the effect of improving the flatness of the surface is small. If the number exceeds 30, dislocations are easily introduced into the crystal.

On the second stacked body 220, a first stacked body 210 is formed. For instance, GaInN layers and AlGaInN layers are alternately stacked. The thickness of the GaInN layer is thinner than the thickness of the well layer 42. The thickness of the AlGaInN layer is 7 nm or less. More preferably, the thickness of the AlGaInN layer is 3 nm or less. In the first stacked body 210, the number of AlGaInN layers and the number of GaInN layers are 16 or more and 40 or less. Preferably, the total thickness of the plurality of GaInN layers is thicker than 22.5 nm and thinner than 40 nm. More preferably, the total thickness of the first stacked body 210 is thicker than 70 nm and thinner than 120 nm.

Further thereon, a Si-doped n-type $Al_{0.065}Ga_{0.93}In_{0.005}N$ layer is formed as a first barrier layer BL1 with a thickness of 13.5 nm and a Si concentration of $0.5×10^{19}$ cm$^{-3}$ or more and $2×10^{19}$ cm$^{-3}$ or less. Further thereon, a $Ga_{0.85}In_{0.15}N$ layer is formed as a first well layer 42 with a thickness of 3.5 nm. Further thereon, a $Ga_{0.99}In_{0.01}N$ layer is formed as an inter-well barrier layer BLI with a thickness of 3 nm. Further thereon, a $Ga_{0.85}In_{0.15}N$ layer is formed as a second well layer 42 with a thickness of 3.5 nm. Further thereon, a GaN layer is formed as a barrier layer 41 (p-side barrier layer BLp) with a thickness of 6 nm. Thus, a light emitting unit 140 including two well layers 42 is formed.

Further thereon, a Mg-doped p-type $Al_{0.15}Ga_{0.85}N$ layer (the Mg concentration is $1.8×10^{19}$ cm$^{-3}$ on the light emitting unit 140 side and $1×10^{19}$ cm$^{-3}$ on the opposite side from the light emitting unit 140) is formed as a p-type confinement layer 151 with a thickness of 24 nm. Further thereon, a Mg-doped p-type GaN layer (the Mg concentration is $1×10^{19}$ cm$^{-3}$ on the p-type confinement layer 151 side and $5×10^{19}$ cm$^{-3}$ or more and $9×10^{19}$ cm$^{-3}$ or less on the opposite side from the p-type confinement layer 151) is formed as a p-type contact layer 152. The Al concentration in the p-type confinement layer 151 is e.g. 0.13 or more and 0.28 or less. In particular, if the Al concentration is set to 0.13 or more and 0.16 or less, high quality crystal is easily obtained. Because AlGaN with excessively large bandgap energy is not used, the device resistance can be decreased.

The semiconductor layer stacked body including the above semiconductor layers is provided with electrodes by e.g. the method illustrated below.

In a partial region of the semiconductor layer stacked body, the second layer 150 and the light emitting unit 140 are removed by dry etching using a mask until the n-type contact layer 132 is exposed at the surface. Then, entirely on the semiconductor layer stacked body including the exposed surface of the first layer 130, a $SiO_2$ layer is formed with a thickness of 400 nm by using a thermal CVD (chemical vapor deposition) apparatus. This $SiO_2$ layer is not shown in FIG. 1 and the like.

To form a p-side electrode 160, a patterned resist for resist lift-off is formed on the semiconductor layer stacked body. Then, the $SiO_2$ layer on the p-type contact layer 152 is removed by ammonium fluoride treatment. On this region where the $SiO_2$ layer is removed, for instance, by using a vacuum evaporation apparatus, reflective and conductive Ag is formed as a p-side electrode 160 with a thickness of 200 nm and sintered for one minute in a nitrogen atmosphere at 350° C.

To form an n-side electrode 170, a patterned resist for resist lift-off is formed on the semiconductor layer stacked body. The $SiO_2$ layer on the exposed n-type contact layer 132 is removed by ammonium fluoride treatment. On this region where the $SiO_2$ layer is removed, for instance, a stacked film of Ti layer/Pt layer/Au layer is formed with a thickness of 500 nm. Thus, the n-side electrode 170 is formed.

The n-side electrode 170 can be made of e.g. a silver alloy (e.g., including Pd at approximately 1%). In this case, to improve ohmic contact, for instance, the n-type contact layer 132 is formed in a two-layer structure. Specifically, as an electrode formation portion, a high concentration layer having a Si concentration of $1.5×10^{19}$ cm$^{-3}$ or more and $3×10^{19}$ cm$^{-3}$ or less is grown with a thickness of approximately 0.3 μm. This can suppress reliability decrease due to Si segregation.

Next, the rear surface of the substrate 110 (the surface on the opposite side from the first buffer layer 121) is polished. The substrate 110 and the semiconductor layer stacked body are cut by e.g. cleavage or diamond blade cutting. Thus, a singulated LED device, i.e., the semiconductor device 10 according to the embodiment, is fabricated. The semiconductor device 10 has a width of e.g. 400 μm and a thickness of e.g. 100 μm.

The peak wavelength of light emission in the semiconductor device 10 thus fabricated is 440 nm or more and 450 nm or less. The embodiment is not limited thereto. By controlling at least one of the In concentration and the Al concentration of the well layer 42, light emission with a peak wavelength of 380 nm or more and 780 nm or less can be obtained. In particular, in the range of 380 nm or more and 560 nm or less, good light emission is achieved. Furthermore, in the range of 385 nm or more and 460 nm or less, the degree of freedom in the configuration of various layers included in the semiconductor device 10 is increased. Thus, a semiconductor device with particularly high efficiency is easily achieved.

The method for forming the semiconductor layers included in the semiconductor device 10 according to the embodiment can be based on e.g. the metal organic chemical vapor deposition method and the molecular beam epitaxy method. However, in the embodiment, the method for forming the semiconductor layers is arbitrary.

The substrate 110 is made of e.g. sapphire, SiC, GaN, GaAs, and Si. However, in the embodiment, the substrate 110 is arbitrary. The substrate 110 may be removed after growth of the semiconductor layers.

The semiconductor device 10 according to the embodiment achieves high efficiency light emission by taking advantage of low defect crystal. To this end, the semiconductor device 10 is based on the configuration for increasing the efficiency of the light emitting unit 140 itself and the configuration for facilitating the use of a thick p-type confinement layer 151 having high Al concentration to suppress the overflow of electrons from the light emitting unit 140.

In the following, examples of each layer included in the semiconductor device 10 according to the embodiment are described.

The first AlN buffer layer 121a of high carbon concentration serves to relax the difference in crystal type from the substrate 110. In particular, the first AlN buffer layer 121a reduces screw dislocations. Furthermore, by the second AlN buffer layer 121b of high purity, the surface is flattened at the atomic level. This reduces crystal defects in the non-doped GaN buffer layer (second buffer layer 122) grown thereon. To this end, the thickness of the second AlN buffer layer 121b of high purity is preferably thicker than 1 µm. To prevent strain-induced formation of high density dislocations, the thickness of the second AlN buffer layer 121b of high purity is preferably 4 µm or less.

The first buffer layer 121 can be made of AlN as described above. However, the embodiment is not limited thereto. For instance, $Al_{\alpha2}Ga_{1-\alpha2}N$ ($0.8 \leq \alpha2 \leq 1$) can also be used. In this case, the wafer warpage can be compensated by adjusting the Al concentration.

The second buffer layer 122 (lattice relaxation layer) serves for defect reduction and strain relaxation by three-dimensional island growth on the first buffer layer 121. To flatten the growth surface, the average thickness of the second buffer layer 122 (lattice relaxation layer) is preferably set to 0.6 µm or more. In view of reproducibility and warpage reduction, the thickness of the second buffer layer 122 (lattice relaxation layer) is preferably 0.8 µm or more and 2 µm or less.

By adopting these buffer layers, the dislocation density can be reduced to 1/10 or less compared with conventional low temperature growth buffer layers. This enables crystal growth at such high growth temperature and high ratio of group V raw material to group III raw material that are otherwise difficult to adopt due to abnormal growth. Thus, generation of point defects is suppressed. This enables high concentration doping of the AlGaN layer and the barrier layer 41 (such as the first barrier layer BL1) with high Al composition.

In the case where the substrate is made of Si, the first AlN buffer layer 121a serves to relax the difference in crystal type from the substrate 110. In particular, the first AlN buffer layer 121a reduces screw dislocations. The second AlN buffer layer 121b of high purity is provided as necessary, and may be omitted as the case may be. The second AlN buffer layer 121b reduces crystal defects in the non-doped GaN buffer layer (second buffer layer 122) grown thereon. The thickness of the first AlN buffer layer 121a is preferably 6 nm or more, and more preferably 10 nm or more. At a thickness of 6 nm or more, the effect of protecting the substrate surface is achieved. At a thickness of 10 nm or more, the effect of suppressing dislocations is enhanced. To prevent strain-induced warpage, the thickness of the second AlN buffer layer 121b of high purity is preferably 4 µm or less.

Also in the case where the substrate is made of Si, the first buffer layer 121 can be made of AlN as described above. However, the embodiment is not limited thereto. For instance, $Al_{\alpha2}Ga_{1-\alpha2}N$ ($0.8 \leq \alpha2 \leq 1$) can be used. In this case, the wafer warpage can be compensated by adjusting the Al composition.

As described above, the first barrier layer BL1 includes e.g. a Si-doped quaternary mixed crystal of AlGaInN (the Al concentration is 6% or more and 10% or less, and the In concentration is 0.3% or more and 1.0% or less). The other barrier layers 41 (interwell barrier layer BLI and p-side barrier layer BLp) include e.g. a quaternary mixed crystal of AlGaInN (the Al composition is 6% or more and 10% or less, and the In concentration is 0.3% or more and 1.0% or less), where Si doping is arbitrary. The well layer 42 includes e.g. $In_{0.05}Ga_{0.95}N$ (the In concentration can be appropriately varied in the range of 4% or more and 10% or less).

To produce ultraviolet light emission with high efficiency at an emission wavelength of 380 nm or more and 400 nm or less, the Al concentration in the first barrier layer BL1 is set to 6% or more to form a deep potential.

The composition of the first barrier layer BL1 can be appropriately changed. For instance, the first barrier layer BL1 can be made of AlGaInN with Al concentration lower than 6%. The first barrier layer BL1 can be made of GaInN having lower In concentration than the well layer 42.

The composition of the barrier layers 41 other than the first barrier layer BL1 can also be appropriately changed. Like the first barrier layer BL1, these barrier layers 41 can be made of AlGaInN with Al concentration lower than 6% or GaN. These barrier layers 41 can be made of GaInN having lower In concentration than the well layer 42.

More preferably, the barrier layers 41 other than the first barrier layer BL1 are made of a crystal having lower Al concentration or higher In concentration than the first barrier layer BL1. Unlike the first barrier layer BL1, the barrier layers 41 other than the first barrier layer BL1 are formed on the well layer 42 of GaInN. Thus, by forming these barrier layers 41 from a material having similar material properties to the well layer 42 of GaInN, high quality crystal growth at lower temperature is enabled. This can suppress degradation of the GaInN layer during crystal growth due primarily to the influence of heat. Furthermore, the difference in bandgap energy between the barrier layer 41 and the well layer 42 is reduced. This can increase uniformity of the carrier distribution, and can increase the utilization efficiency of carriers. Furthermore, the influence of electrical resistance resulting from the difference in bandgap energy between the barrier layer 41 and the well layer 42 can be reduced. Thus, the operating voltage of the semiconductor device can be reduced.

The In concentration of the well layer 42 may be lower or higher than the foregoing. For instance, a lower In concentration of the well layer 42 enables light emission at a wavelength nearer to 365 nm. For instance, for light emission in the wavelength band of 400 nm or more and 440 nm or less, good light emission is achieved if the In concentration of the well layer 42 is set to 0.2 or more and 0.3 or less. For instance, for light emission in the wavelength band of 440 nm or more and 460 nm or less, the In concentration of the well layer 42 may be set to 0.3 or more and 0.4 or less. For instance, for light emission in the wavelength band of 460 nm or more and 500 nm or less, the In concentration of the well layer 42 may be set to 0.3 or more and 0.5 or less. To achieve light emission at longer wavelength, the In concentration of the well layer 42 may be appropriately increased in the range of 1 or less.

The thickness of the p-side barrier layer BLp is set to e.g. 2 nm or more. Setting the thickness of the p-side barrier layer BLp to 2 nm or more suppresses e.g. the phenomenon in which the well layer 42 is degraded during increasing the growth temperature to grow the second layer 150 after growing the p-side barrier layer BLp. For instance, if the thickness of the p-side barrier layer BLp is thinner than 3 nm, then for instance, the emission wavelength of the well layer 42 may be varied under the influence of the p-type AlGaN layer. If the thickness of the p-side barrier layer BLp is set to 4.5 nm or more, there is a significant effect of controlling the characteristics variation of the well layer 42 including the influence of impurity diffusion. If the thickness of the p-side barrier layer BLp is thicker than the thickness of the well layer 42, there is a significant effect of relaxing the influence of the strain between the AlGaN layer and the well layer 42. If the p-side barrier layer BLp is too thick, the device resistance may be increased. Furthermore, if the p-side barrier layer BLp is too thick, for instance, carriers overflowing the well layer 42 are accumulated and cause absorption. To reduce this influence, the p-side barrier layer BLp is preferably made thinner than the first barrier layer BL1. In a semiconductor device with the thickness of the p-side barrier layer BLp set to 9 nm or less, the device was successfully operated with a voltage increase of 10% or less of the operating voltage anticipated from the emission wavelength.

The thickness of the first barrier layer BL1 is set to a value in the range of e.g. 4.5 nm or more and 30 nm or less. If the thickness of the first barrier layer BL1 is set to 4.5 nm or more, the intrinsic material properties are developed, and the effect of suppressing hole overflow is achieved. Furthermore, in the case where the thickness of the first barrier layer BL1 is 30 nm or less, high quality crystal growth can be performed relatively easily. The thickness of the first barrier layer BL1 is preferably thicker than that of the well layer 42. By setting the thickness of the first barrier layer BL1 to be thicker than the thickness of the well layer 42, carrier supply to the well layer 42 is effectively controlled. In particular, the thickness of the first barrier layer BL1 is preferably twice or more the thickness of the well layer 42. Setting the thickness of the first barrier layer BL1 to twice or more the thickness of the well layer 42 enables carrier supply to both sides of the first barrier layer BL1. This improves the accuracy of carrier supply to the well layer 42. As described above, the first barrier layer BL1 can be doped with Si at high concentration to reduce the influence of the piezoelectric field applied to the well layer 42. Thus, light emission with high efficiency can be achieved.

If the Al concentration in the barrier layer 41 exceeds 10%, the crystal quality is degraded. By doping the barrier layer 41 with a small amount of In, for instance, the crystal quality is improved. By setting the In concentration in the barrier layer 41 to 0.3% or more, the effect of improving the crystal quality is observed. If the In concentration exceeds 1.0%, the crystal quality is degraded, and the light emission efficiency is decreased. However, in the case where the thickness is thin, the In concentration can be increased to 2%.

For instance, in the embodiment, in the case where the thickness of the first barrier layer BL1 is 15 nm or more, the In concentration is limited up to approximately 1%. However, if the first barrier layer BL1 is thinned to 7 nm, then even if the In concentration is set to 2%, the crystal is not degraded, and intense light emission is achieved.

An example technique for growing the first barrier layer BL1 is described. It is difficult to grow a layer of quaternary mixed crystal AlGaInN with high crystal quality. Furthermore, the crystal doped with Si at high concentration is prone to degradation. By optimizing the configuration and growth condition of the LED device, the present inventors successfully increased the In concentration of the barrier layer BL1 made of AlGaInN without degrading the crystal quality.

For instance, as described above, in the embodiment, if the thickness of the first barrier layer BL1 exceeds 15 nm, the In concentration is limited up to approximately 1%. However, if the first barrier layer BL1 is thinned to 7 nm, then even if the In concentration is set to 2%, the crystal is not degraded, and intense light emission is achieved.

Increasing the In concentration improves the steepness of the interface with the well layer 42 of GaInN and improves the crystallinity of the well layer 42. As a result, the first barrier layer BL1 of AlGaInN can be doped with Si at high concentration.

Furthermore, by thinning the first barrier layer BL1 having high Si concentration, the first barrier layer BL1 can be doped with Si at higher concentration.

The Al concentration of the first barrier layer BL1 can be set higher than the Al concentration of the p-side barrier layer BLp. This increases the bandgap energy of the first barrier layer BL1. Thus, the confinement effect for holes is increased. This reduces leakage of current at the high injection current, and can increase the optical output. For electrons, the p-type confinement layer 151 (p-type AlGaN layer) serves as a barrier. Thus, the Al concentration of the p-side barrier layer BLp is set sufficiently lower than that of the p-type confinement layer 151.

For instance, the Al concentration of the first barrier layer BL1 can be set to 8% or more, and the Al concentration of the p-side barrier layer BLp can be set to 0%. In this case, the first barrier layer BL1 is grown at high temperature. Then, by decreasing the temperature to a lower growth temperature, the well layer 42 and the p-side barrier layer BLp may be grown.

The interwell barrier layer BLI may be made of GaN or GaInN. For instance, the first barrier layer BL1 with high Al concentration is grown at high temperature. The well layer 42 and the interwell barrier layer BLI are grown at low temperature. The p-side barrier layer BLp with low Al concentration is grown at low temperature. Thus, for instance, a well layer 42 with high In concentration can be grown with good characteristics. Here, after the p-side barrier layer BLp is grown to a thickness for protecting the surface of the well layer 42, the p-side barrier layer BLp may be grown at increased temperature.

For instance, the first barrier layer BL1 may be formed in a two-layer structure by combining an AlGaN layer having high Al concentration and an AlGaInN layer having low Al concentration. For instance, this AlGaN layer can suppress overflow of holes, and the AlGaInN layer can improve the characteristics of the crystal surface. Thus, the well layer 42 can be formed on the crystal surface with improved characteristics. In this case, the AlGaN layer and part of the AlGaInN layer may be grown at high temperature, and the rest of the AlGaInN layer may be grown at the same temperature as the well layer 42. By using such a method, a high quality AlGaN crystal can be grown at high temperature, and the well layer 42 can be grown at a temperature suitable for the well layer 42.

Such temperature change requires a large amount of time and decreases the process efficiency. However, in a configuration in which the light emitting unit 140 includes a small number of well layers 42 (e.g., the configuration including three or less well layers 42), the decrease of process efficiency can be suppressed.

For instance, in the case where the number of well layers 42 is three (e.g., semiconductor device 10c), for instance, the In concentration and the Ga concentration in the well layer 42 are e.g. 0.12 and 0.88, respectively. Thus, for instance, the light emitting unit 140 emits blue light having a peak wavelength in the wavelength region of approximately 400 nm. Also in this semiconductor device, the bandgap energy of the cladding layer is higher than the bandgap energy of the well layer 42.

Figure 4:
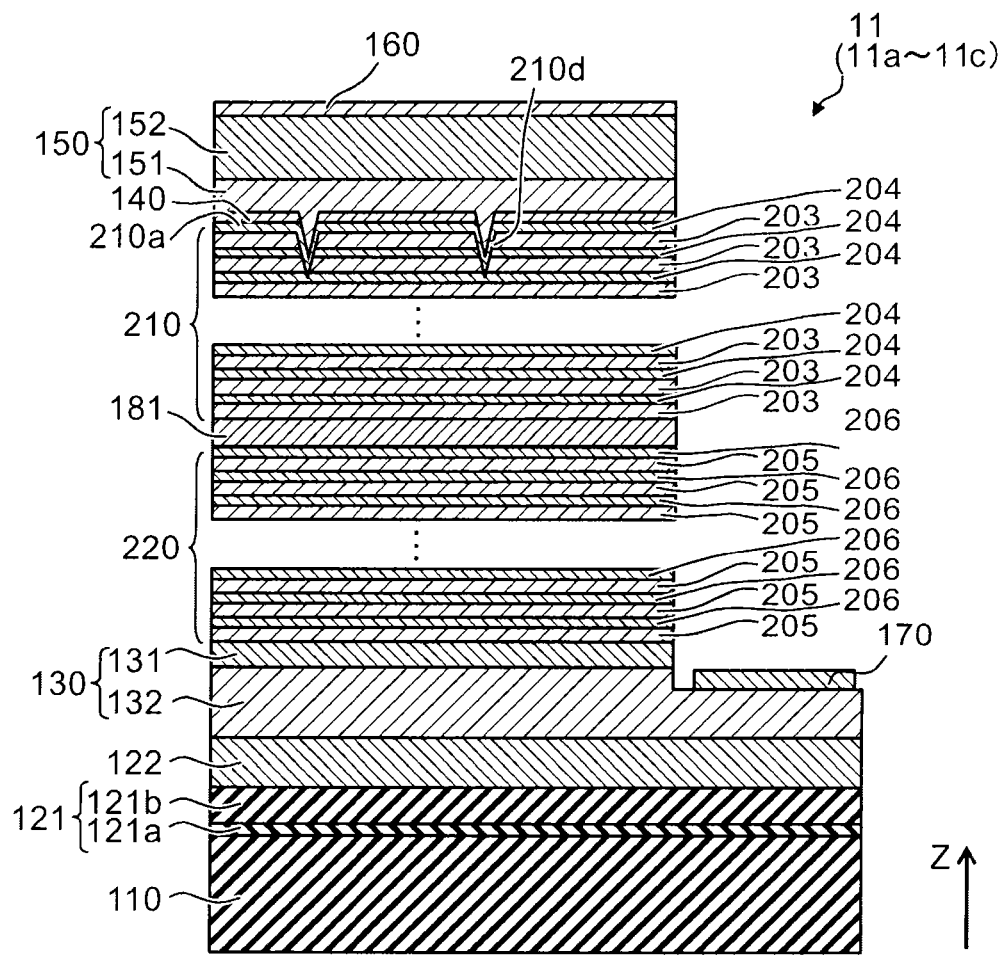
FIG. 4 is a schematic sectional view illustrating an alternative semiconductor device according to the first embodiment.

FIG. 4 is a schematic sectional view illustrating the configuration of an alternative semiconductor device according to the first embodiment. As shown in FIG. 4, in the semiconductor device 11 (and semiconductor devices 11a-11c) according to the embodiment, an intermediate layer 181 is provided between the first stacked body 210 and the second stacked body 220.

In the semiconductor device 11, on the second stacked body 220, for instance, a GaN layer having a thickness of 2.5 nm is formed as an intermediate layer 181 by the metal organic chemical vapor deposition method or MOCVD method at 800-900° C. Then, on the intermediate layer 181, the first stacked body 210 is formed.

The intermediate layer 181 can be made of at least one of GaN, GaInN, AlGaN, AlGaIn, and AlN. The thickness of the intermediate layer 181 is preferably thinner than the thickness of the light emitting unit 140 (the total thickness of the light emitting unit 140). If the intermediate layer 181 is thinner than the light emitting unit 140, the effect of the strain of the first stacked body 210 can be transmitted not only to the light emitting unit 140 but also to the second stacked body 220. The effect of the strain of the second stacked body 220 is strongly received by the first stacked body 210. Thus, an interaction effectively occurs therebetween. The intermediate layer 181 is provided as necessary, and can be omitted as the case may be.

Figure 5:
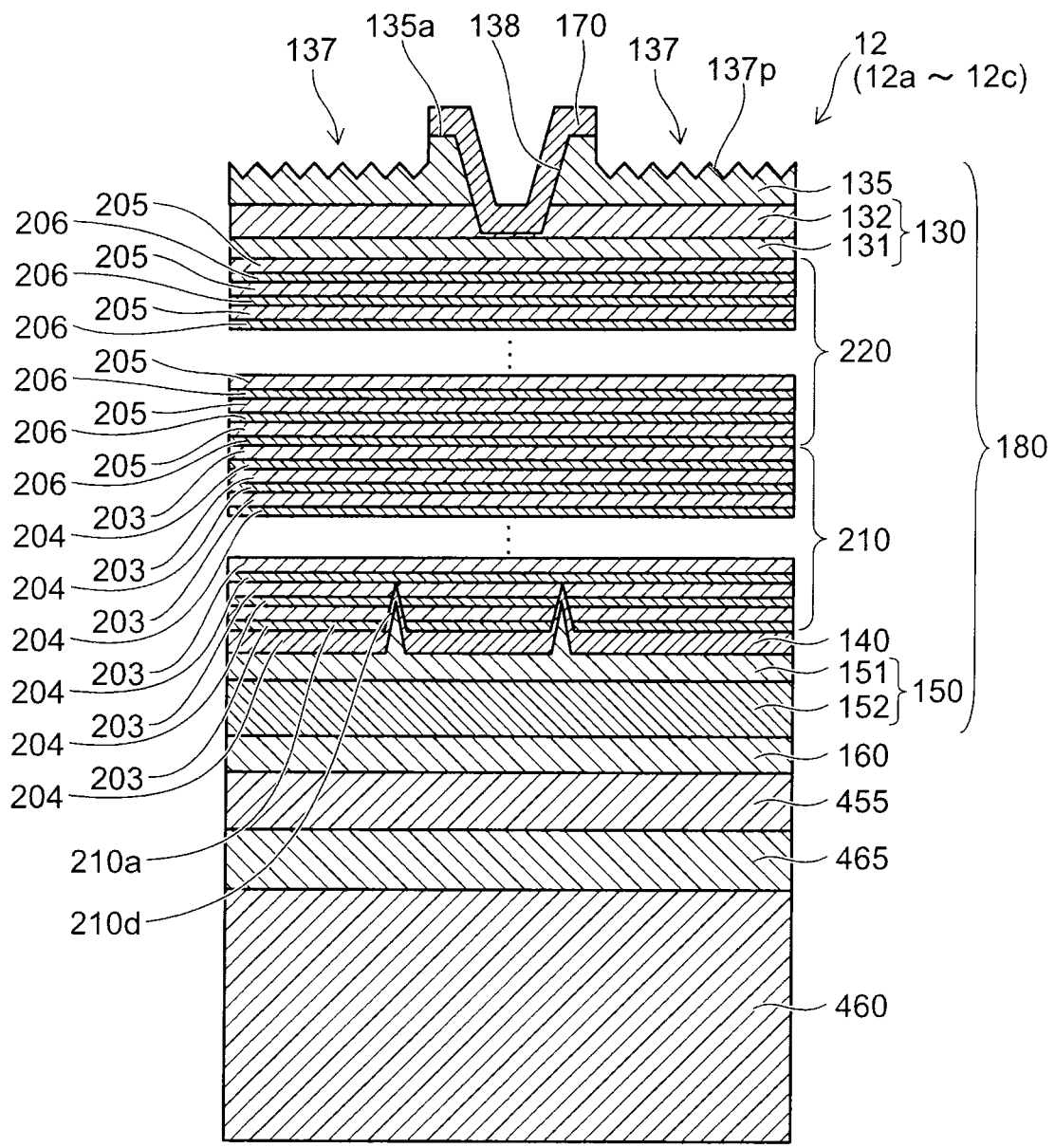
FIG. 5 is a schematic sectional view illustrating an alternative semiconductor device according to the first embodiment.

FIG. 5 is a schematic sectional view illustrating the configuration of an alternative semiconductor device according to the first embodiment. As shown in FIG. 5, in the alternative semiconductor device 12 (and semiconductor devices 12a-12c) according to the embodiment, a first metal layer 455 is provided between a conductive substrate 460 and the p-side electrode 160. A second metal layer 465 is provided between the conductive substrate 460 and the first metal layer 455.

The semiconductor device 12 (12a-12c) includes a low impurity concentration semiconductor layer 135. The n-type contact layer 132 is placed between the low impurity concentration semiconductor layer 135 and the second stacked body 220 (between the low impurity concentration semiconductor layer 135 and the light emitting unit 140). The n-type confinement layer 131 is placed between the n-type contact layer 132 and the second stacked body 220.

The impurity concentration in the low impurity concentration semiconductor layer 135 is lower than the impurity concentration in the n-type contact layer 132. The low impurity concentration semiconductor layer 135 is made of e.g. a non-doped GaN layer. As the low impurity concentration semiconductor layer 135, the second buffer layer 122 (lattice relaxation layer) described above can be used.

The low impurity concentration semiconductor layer 135 is provided with an opening 138. The opening 138 exposes part of the n-type contact layer 132. From the major surface 135a of the low impurity concentration semiconductor layer 135 on the opposite side from the n-type contact layer 132, the opening 138 extends to the n-type contact layer 132. That is, the bottom of the opening 138 extends to the n-type contact layer 132.

The n-side electrode 170 is provided so as to cover the n-type contact layer 132 exposed in the opening 138 and part of the low impurity concentration semiconductor layer 135.

The major surface 135a of the low impurity concentration semiconductor layer 135 not covered with the n-side electrode 170 is provided with a rough surface portion 137 including an unevenness 137p.

The semiconductor device 12 (12a-12c) is fabricated by e.g. the following method. For instance, on a substrate 110 made of sapphire, crystal layers of a first buffer layer 121, a second buffer layer 122 (constituting a low impurity concentration semiconductor layer 135), an n-type contact layer 132, an n-type confinement layer 131, a second stacked body 220, a first stacked body 210, a light emitting unit 140, a p-type confinement layer 151, and a p-type contact layer 152 are formed to form a crystal stacked body 180.

A p-side electrode 160 is formed on the p-type contact layer 152 of the crystal stacked body 180. Then, the crystal stacked body 180 is bonded to a conductive substrate 460. Then, the substrate 110 and the first buffer layer 121 are removed. Furthermore, an n-side electrode 170 is formed on the exposed crystal layer (n-type contact layer 132). A rough surface portion 137 (i.e., unevenness 137p) is formed on the low impurity concentration semiconductor layer 135. Thus, the semiconductor device 12 is obtained.

Also in this case, a depression 210d is provided in the surface 210a on the light emitting unit 140 side of the first stacked body 210. Part of the light emitting unit 140 is embedded in at least part of the depression 210d. Thus, the embodiment provides a semiconductor device having high efficiency. For instance, part of the second layer 150 is placed on the part of the light emitting unit 140 embedded in at least part of the depression 210d. Furthermore, part of the second layer 150 may be embedded in (the remaining space of) at least part of the depression 210d.

In the semiconductor device 12, for instance, the size of the unevenness 137p is set larger than the wavelength of emission light emitted from the light emitting unit 140. Specifically, the size of the unevenness 137p is set larger than the wavelength in the low impurity concentration semiconductor layer 135 of emission light emitted from the light emitting unit 140. Thus, the optical path is changed in the rough surface portion 137 provided with the unevenness 137p. This increases the light extraction efficiency. Thus, a semiconductor device having higher efficiency is obtained.

Figure 6:
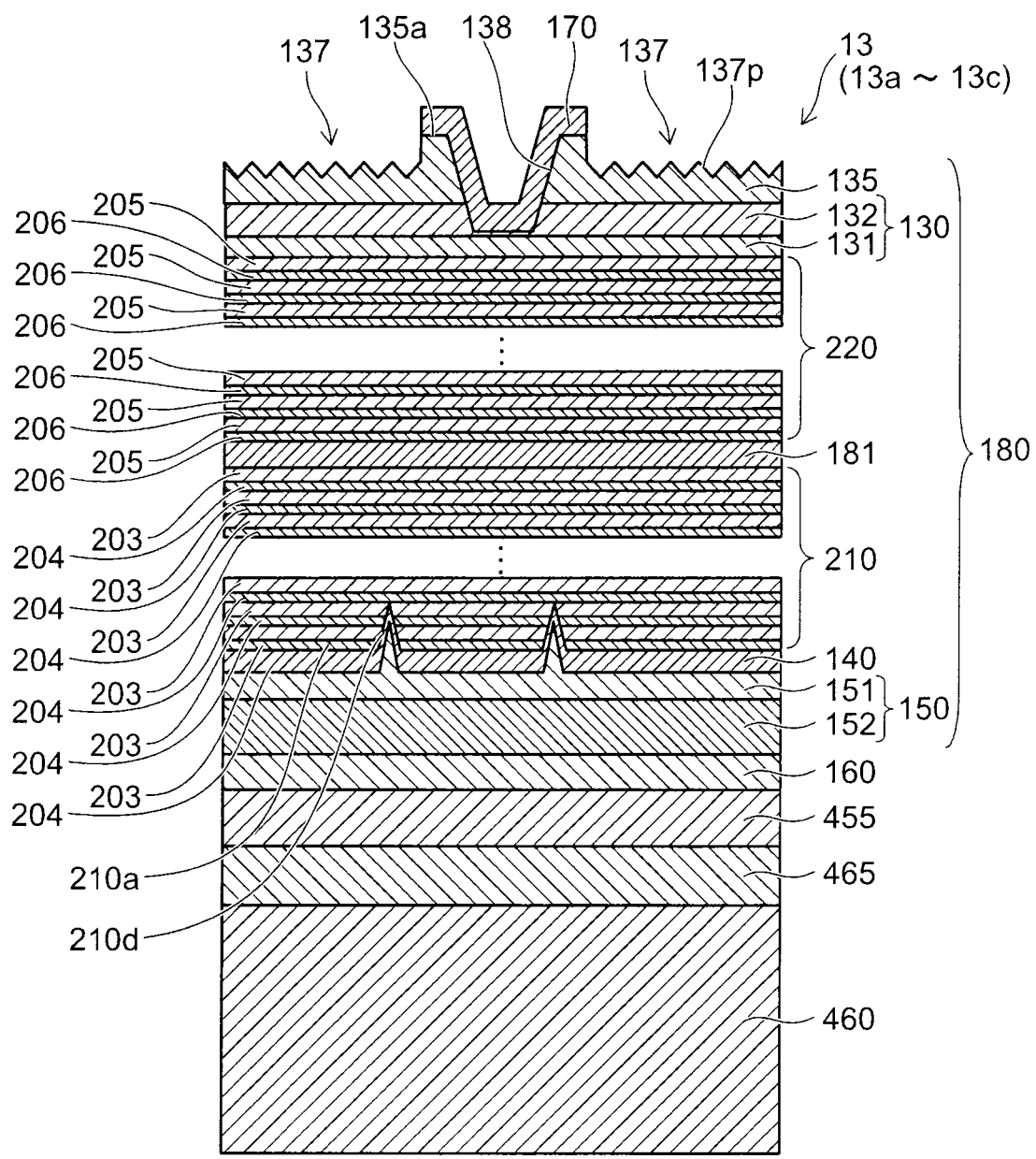
FIG. 6 is a schematic sectional view illustrating an alternative semiconductor device according to the first embodiment.

FIG. 6 is a schematic sectional view illustrating the configuration of an alternative semiconductor device according to the first embodiment. As shown in FIG. 6, the alternative semiconductor device 13 (and semiconductor devices 13a-13c) according to the embodiment is different from the semiconductor device 12 (and semiconductor devices 12a-12c) in that an intermediate layer 181 is provided between the first stacked body 210 and the second stacked body 220. This configuration also provides a semiconductor device having high efficiency.

(Second Embodiment)

Figure 7:
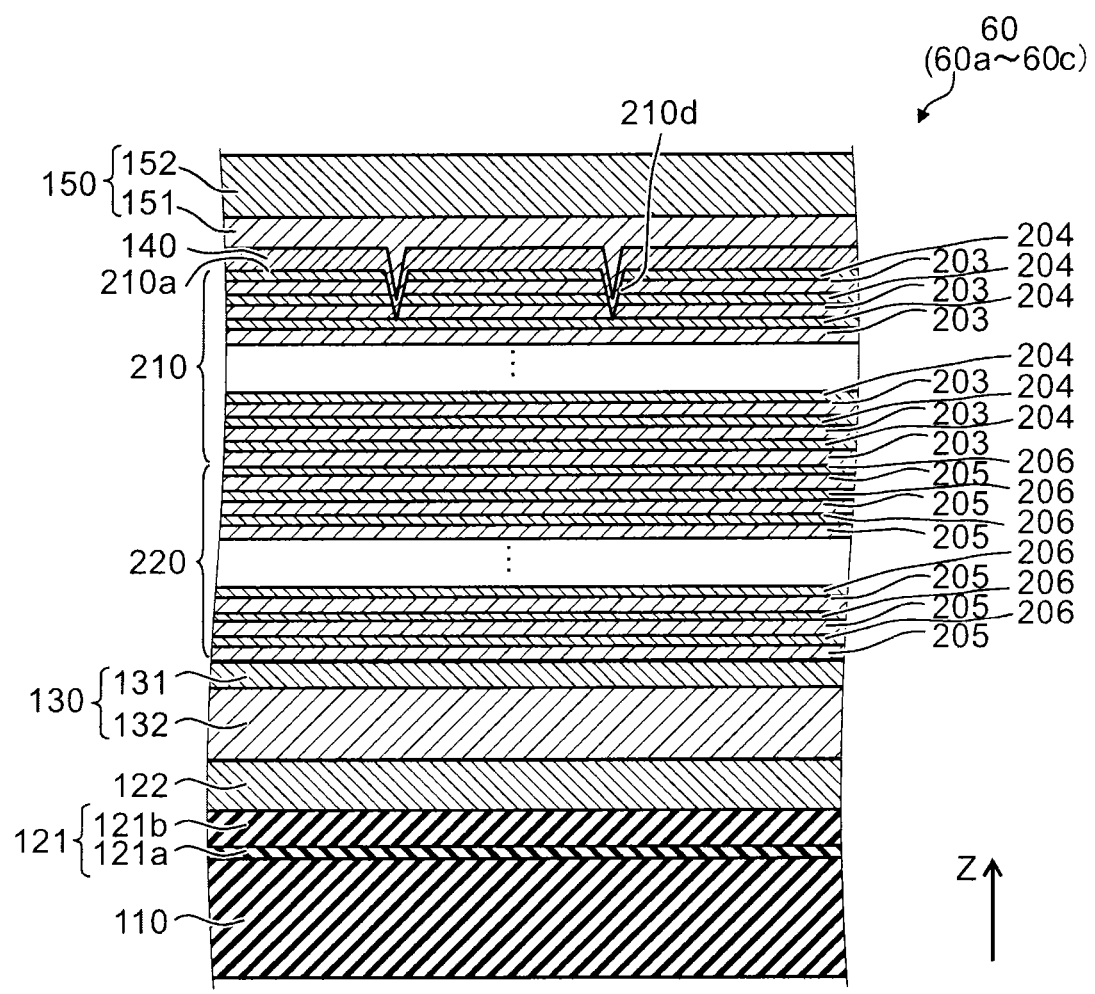
FIG. 7 is a schematic sectional view illustrating a wafer according to a second embodiment.

FIG. 7 is a schematic sectional view illustrating the configuration of a wafer according to a second embodiment.

As shown in FIG. 7, the wafer 60 (wafer 60a-60c) according to the embodiment includes a substrate 110, a first layer 130, a first stacked body 210, a light emitting unit 140, and a second layer.

The first layer 130 is provided on the substrate 110. The first layer 130 includes a nitride semiconductor and has n-type. The first stacked body 210 is provided on the first layer 130. The first stacked body 210 includes a plurality of third layers 203 including AlGaInN, and a plurality of fourth layers alternately stacked with the plurality of third layers 203 and including GaInN.

The light emitting unit 140 is provided on the first stacked body 210. The light emitting unit 140 includes a plurality of barrier layers 41 and a well layer 42 provided between the plurality of barrier layers 41. The second layer 150 is provided on the light emitting unit 140. The second layer 150 includes a nitride semiconductor and has p-type.

The first stacked body 210 includes a depression 210d provided in the surface 210a on the light emitting unit 140 side of the first stacked body 210. Part of the light emitting unit 140 is embedded in at least part of the depression 210d (see FIG. 3). For instance, part of the second layer 150 is placed on the part of the light emitting unit 140 embedded in at least part of the depression 210d. Furthermore, part of the second layer 150 may be embedded in (the remaining space of) at least part of the depression 210d.

Thus, the embodiment can provide a wafer having high efficiency.

As described with reference to FIG. 3, also in the wafer 60 (60a-60c), the depression 210d does not penetrate through the first stacked body 210. Furthermore, a dislocation 510 penetrating through the first layer 130, the first stacked body 210, the light emitting unit 140, and the second layer 150 is formed. The side surface 210s of the depression 210d surrounds the dislocation 510.

As illustrated in FIG. 7, the wafer 60 (60a-60c) further includes a second stacked body 220. The second stacked body 220 is provided between the first layer 130 and the first stacked body 210. The second stacked body 220 includes a plurality of fifth layers 205 and a plurality of sixth layers 206. The plurality of fifth layers 205 have a composition different from the composition of the third layers 203 and include a nitride semiconductor. The plurality of sixth layers 206 are alternately stacked with the plurality of fifth layers 205. Each sixth layer 206 has a thickness thinner than the thickness of the well layer 42 and includes GaInN. The fifth layer 205 includes e.g. GaN. The thickness of each of the plurality of fifth layers 205 is thinner than the thickness of each of the plurality of barrier layers 41.

The thickness of each fourth layer 204 of the first stacked body 210 is thinner than the thickness of the well layer 42. Also in this case, the wafer 60 (60a-60c) can further include an intermediate layer 181. The intermediate layer 181 is provided between the first stacked body 210 and the second stacked body 220. The intermediate layer 181 is thinner than the thickness of the light emitting unit 140.

In the wafer 60 (60a-60c), the well layer 42 includes e.g. at least one of GaInN and AlGaInN. Of the plurality of barrier layers 41, the first barrier layer BL1 is the nearest to the first stacked body 210. The first barrier layer BL1 includes AlGaInN.

The wafer 60 (60a-60c) can include a first buffer layer 121 provided between the substrate 110 and the first layer 130, and a second buffer layer 122 provided between the first buffer layer 121 and the first layer 130. The first buffer layer 121 can include a first AlN buffer layer 121a provided between the substrate 110 and the second buffer layer 122, and a second AlN buffer layer 121b provided between the first AlN buffer layer 121a and the second buffer layer 122.

(Third Embodiment)

Figure 8:
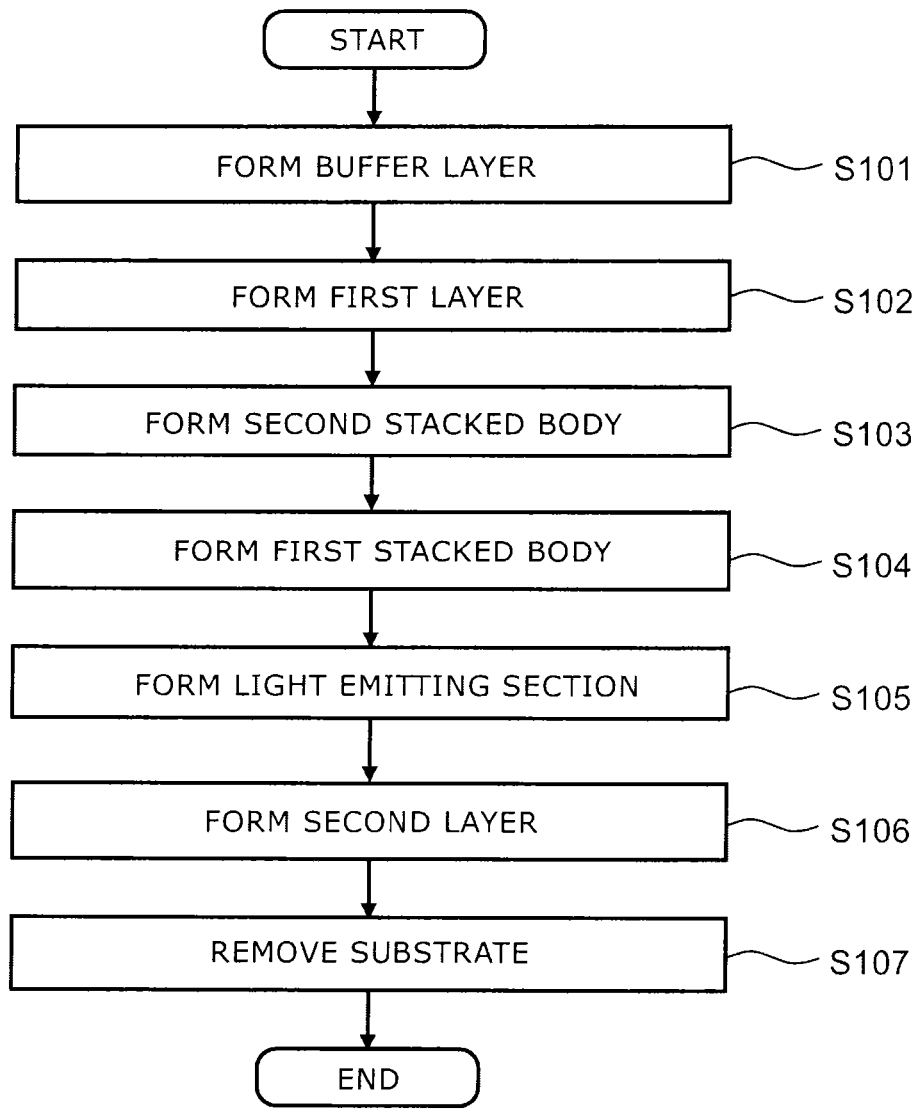
FIG. 8 is a flow chart illustrating a method for manufacturing a semiconductor device according to a third embodiment.

FIG. 8 is a flow chart illustrating a method for manufacturing a semiconductor device according to a third embodiment.

As shown in FIG. 8, in the method for manufacturing a wafer according to the embodiment, a first layer 130 of n-type including a nitride semiconductor is formed on a substrate 110 (step S102). As necessary, before step S102, a buffer layer (such as the first buffer layer 121 and the second buffer layer 122 described above) is formed (step S101).

Then, on the first layer 130, a plurality of third layers 203 including AlGaInN and a plurality of fourth layers 204 including GaInN are alternately stacked to form a first stacked body 210 (step S104). As necessary, before step S104, on the first layer 130, fifth layers 205 and a plurality of sixth layers 206 are alternately stacked to form a second stacked body 220 (step S103). The fifth layer 205 has a composition different from the composition of the third layer 203 and includes a nitride semiconductor. Each sixth layer 206 has a thickness thinner than the thickness of the well layer 42 and includes GaInN.

Then, on the first stacked body 210, a light emitting unit 140 is formed (step S105). The light emitting unit 140 includes a plurality of barrier layers 41 and a well layer 42 provided between the plurality of barrier layers 41. Furthermore, on the light emitting unit 140, a second layer 150 of p-type including a nitride semiconductor is formed (step S106). Furthermore, as necessary, after forming the second layer 150, the upper surface of the second layer 150 is bonded to a bonding substrate (e.g., conductive substrate). Then, the substrate 110 is removed (step S107).

The first stacked body 210 includes a depression 210d provided in the surface on the light emitting unit 140 side of the first stacked body 210. The above formation of the light emitting unit 140 includes embedding part of the light emitting unit 140 in at least part of the depression 210d. The above formation of the second layer 150 includes embedding part of the second layer 150 in at least part of the remaining space of the depression 210d.

Thus, a semiconductor device with high efficiency can be manufactured.

By performing the above steps S101-S106, a wafer with high efficiency can be manufactured.

(Fourth Embodiment)

The semiconductor device according to the embodiment includes a semiconductor device such as a semiconductor light emitting device, a semiconductor light receiving device, and an electronic device. In the following, an example of applying the embodiment to a semiconductor light emitting device is described.

Figure 9:
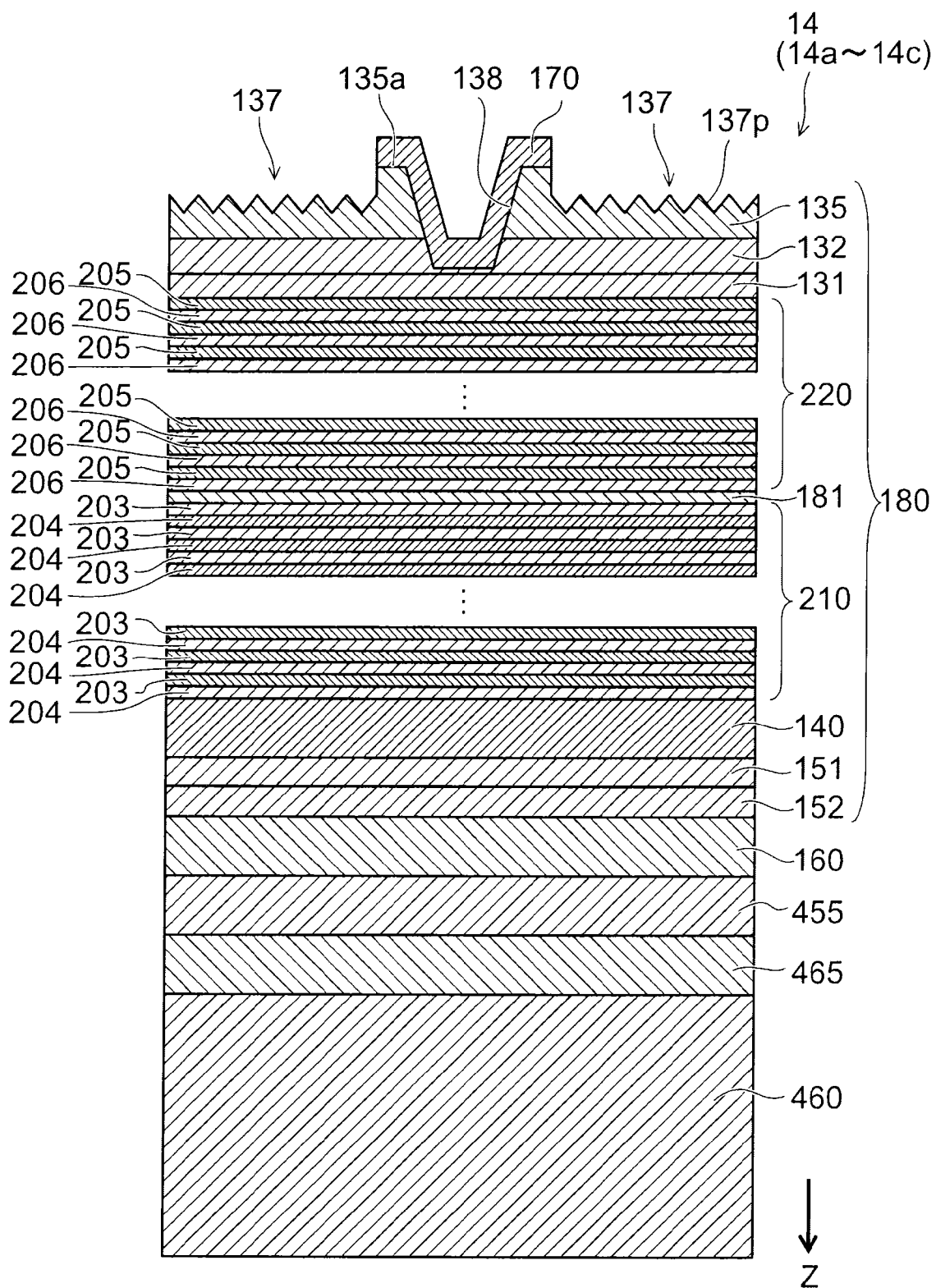
FIG. 9 is a schematic sectional view illustrating a semiconductor device according to a fourth embodiment.

FIG. 9 is a schematic sectional view illustrating the configuration of a semiconductor device according to the fourth embodiment.

As shown in FIG. 9, the semiconductor device 14 according to the embodiment includes a first layer 130, a second layer 150, a light emitting unit 140 (functional section), a first stacked body 210, and a second stacked body 220. The first layer 130, the second layer 150, the light emitting unit 140, the first stacked body 210, and the second stacked body 220 can be based on the configuration (including materials) described with reference to the first to third embodiments, and hence the description thereof is omitted. In this example, an intermediate layer 181 is provided between the first stacked body 210 and the second stacked body 220.

Figure 10:
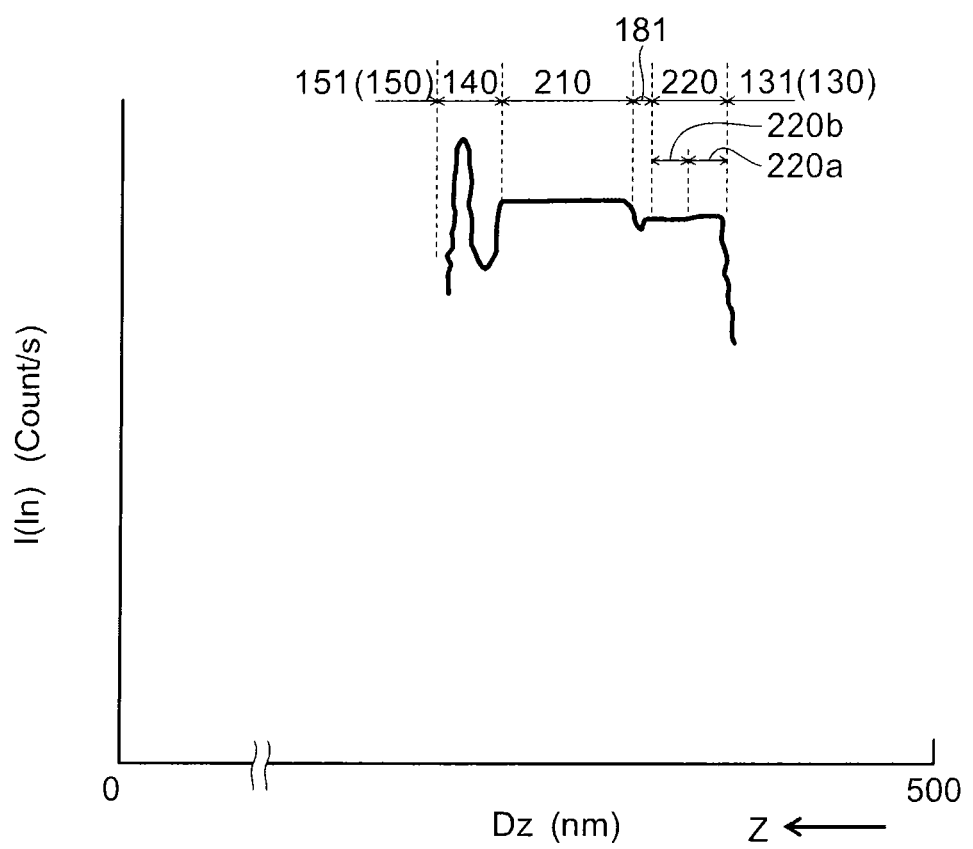
FIG. 10 is a graph illustrating the characteristics of the semiconductor device according to the fourth embodiment.

FIG. 10 is a graph illustrating the characteristics of the semiconductor device according to the fourth embodiment.

More specifically, FIG. 10 illustrates the characteristics for the concentration of In in the semiconductor device 14. This figure shows an example result of SIMS analysis of the semiconductor device 14. The horizontal axis of FIG. 10 represents position Dz (nm) in the depth direction. The vertical axis represents secondary ion intensity I(In) for In (counts/s, counts per second).

As shown in FIG. 10, the concentration of In in the second stacked body 220 is not constant. The average In composition in the portion on the first layer 130 side of the second stacked body 220 is higher than that in the portion on the first stacked body 210 of the second stacked body 220. The average In concentration in the second stacked body 220 gradually decreases from the first layer 130 toward the first stacked body 210. Here, the average In concentration is the average of the In concentrations in the fifth layers 205 and the sixth layers 206.

Thus, the second stacked body 220 includes a first portion 220a near the first layer 130 and a second portion 220b located between the first portion 220a and the light emitting unit 140. The average concentration of In in the first portion 220a is higher than the average concentration of In in the second portion 220b.

On the other hand, the In average concentration in the first stacked body 210 is substantially constant. Thus, the variation along the Z-axis direction of the In average concentration in the first stacked body 210 is smaller than the variation along the Z-axis direction of the In average concentration in the second stacked body 220.

The formation of the above distribution of the In concentration in the second stacked body 220 is attributable to the influence of dislocations 510.

The second stacked body 220 includes GaN layers and GaInN layers. The second stacked body 220 has e.g. a superlattice structure. The lattice mismatch between the GaN layer and the GaInN layer is large, and the growth rate around the dislocation 510 is slow. Hence, a recess is formed around the dislocation 510. At the center of the recess, for instance, the dislocation 510 exists. In this case, a strain is applied thereto by the stacking of the superlattice structure. Thus, the dislocation 510 is gradually bent and directed along a direction generally perpendicular to the layers (Z-axis direction).

In the semiconductor device 14, a recess similar to that illustrated in the schematic view illustrated in FIG. 3 is formed. The opening of the recess depends on the direction of the dislocation 510. In the oblique portion of the dislocation 510, the opening of the recess is wide. As the dislocation 510 becomes vertical (parallel to the Z-axis direction), the opening of the recess becomes smaller. This causes the slope (side surface) of the recess to be formed from a surface stable in terms of energy. It is considered that this results in decreasing the growth rate, decreasing the In incorporation efficiency, and enhancing the symmetry of the side surface of the recess. That is, in the portion where the opening of the recess is wide, In is easily incorporated.

Thus, the In average concentration is high in the first portion 220a (the portion on the first layer 130 side) of the second stacked body 220. As the second stacked body 220 grows and the opening is narrowed, the In average concentration is gradually decreased. It is considered that when the shape of the depression 210d is stabilized, the In average concentration becomes constant.

As shown in FIG. 9, in the semiconductor device 14, a first metal layer 455 is provided between a conductive substrate 460 and the p-side electrode 160. A second metal layer 465 is provided between the conductive substrate 460 and the first metal layer 455. Furthermore, an intermediate layer 181 is provided between the first stacked body 210 and the second stacked body 220.

The semiconductor device 14 includes a low impurity concentration semiconductor layer 135. The n-type contact layer 132 is placed between the low impurity concentration semiconductor layer 135 and the second stacked body 220. The n-type confinement layer 131 is placed between the n-type contact layer 132 and the second stacked body 220.

The impurity concentration in the low impurity concentration semiconductor layer 135 is lower than the impurity concentration in the n-type contact layer 132. The low impurity concentration semiconductor layer 135 is made of a non-doped GaN layer. As the low impurity concentration semiconductor layer 135, the second buffer layer 122 (lattice relaxation layer) described above is used.

The low impurity concentration semiconductor layer 135 is provided with an opening 138. The opening 138 exposes part of the n-type contact layer 132. From the major surface 135a of the low impurity concentration semiconductor layer 135 on the opposite side from the n-type contact layer 132, the opening 138 extends to the n-type contact layer 132. That is, the bottom of the opening 138 extends to the n-type contact layer 132.

The n-side electrode 170 is provided so as to cover the n-type contact layer 132 exposed in the opening 138 and part of the low impurity concentration semiconductor layer 135.

The major surface 135a of the low impurity concentration semiconductor layer 135 not covered with the n-side electrode 170 is provided with a rough surface portion 137 including an unevenness 137p.

The present inventors fabricated the semiconductor device 14 according to the embodiment and evaluated its characteristics. The semiconductor device 14 was fabricated as follows.

On a sapphire substrate (not shown), an AlN layer having a thickness of 2 μm was formed as a first buffer layer 121 by the MOCVD method at approximately 1300° C. Further thereon, a GaN layer having a thickness of 2 μm was formed as a second buffer 122 by the MOCVD method at approximately 1200° C.

Further thereon, a GaN layer (n-type contact layer 132) having a thickness of 4 μm and a Si concentration of $0.2 \times 10^{19}$-$1.5 \times 10^{19}$ cm$^{-3}$ was formed by the MOCVD method at 1050-1200° C. Further thereon, an n-GaN layer (n-type confinement layer 131) having a thickness of 0.5 μm and a Si concentration of $2 \times 10^{17}$-$5 \times 10^{18}$ cm$^{-3}$ was formed by the MOCVD method at 1050-1200° C.

Further thereon, GaN layers (fifth layers 205) having a thickness of 2.5 nm and doped with Si at $8 \times 10^{18}$ cm$^{-3}$ and sixth layers 206 of $Ga_{0.93}In_{0.07}N$ having a thickness of 1 nm were alternately formed 12-20 layers by the MOCVD method at 800-900° C. Thus, a second stacked body 220 is formed.

Further thereon, a GaN layer (intermediate layer 181) having a thickness of 2.5 nm was formed by the MOCVD method at 800-900° C.

Further thereon, $Al_{0.07}Ga_{0.925}In_{0.005}N$ layers (third layers 203) having a thickness of 2 nm and doped with Si at $8 \times 10^{18}$ cm$^{-3}$ and $Ga_{0.93}In_{0.07}N$ layers (fourth layers 204) having a thickness of 1 nm were alternately formed 26-34 layers by the MOCVD method at 800-900° C. Thus, a first stacked body 210 is formed.

Further thereon, an $Al_{0.07}Ga_{0.925}In_{0.005}N$ layer (first barrier layer BL1: barrier layer 41) having a thickness of 13.5 nm and doped with Si at $4 \times 10^{18}$-$16 \times 10^{18}$ cm$^{-3}$ was formed by the MOCVD method at approximately 800-900° C. Further thereon, a $Ga_{0.93}In_{0.07}N$ layer (well layer 42) having a thickness of 7 nm was formed by the MOCVD method at approximately 800-900° C. Further thereon, an $Al_{0.07}Ga_{0.925}In_{0.005}N$ layer (second barrier layer BL2: barrier layer 41) having a thickness of 4-12 nm was formed by the MOCVD method at approximately 800-900° C.

Further thereon, a Mg-doped p-$Al_{0.2}Ga_{0.8}N$ layer (p-type confinement layer 151) having a thickness of 24 nm was formed by the MOCVD method at approximately 950-1100° C.

Further thereon, a p-GaN layer (p-type contact layer 152) having a thickness of 0.3 μm was formed by the MOCVD method at 950-1100° C. Further thereon, a p-side electrode 160 was formed. Further thereon, a first metal layer 455 was formed.

A conductive substrate 460 including a second metal layer 465 was prepared. The first metal layer 455 was bonded to the second metal layer 465. Subsequently, the sapphire substrate was removed by the laser lift-off method. An unevenness structure was formed by etching on the surface of the exposed n-GaN layer (low impurity concentration semiconductor layer 135). Furthermore, by evaporation and lithograph-based patterning, an n-side electrode 170 having a prescribed shape was formed. The pattern of the n-side electrode 170 as viewed along the Z-axis has a cross shape. The cross shape includes a peripheral portion along the periphery of the n-type contact layer 132, a first extending portion passing through the center in the X-axis of the n-type contact layer 132 and extending along the Y-axis, and a second extending portion passing through the center in the Y-axis of the n-type contact layer 132 and extending along the X-axis.

Subsequently, by dividing the workpiece into individual devices, the semiconductor device 14 is obtained. In the semiconductor device 14, the length along the X-axis is approximately 1 mm (millimeter), and the length along the Y-axis is approximately 1 mm.

In the above semiconductor device 14, the intermediate layer 181 can be omitted. The intermediate layer 181 can be made of at least one of GaN, GaInN, AlGaN, AlGaIn, and AlN. The thickness of the intermediate layer 181 is preferably thinner than the thickness of the light emitting unit 140. If the intermediate layer 181 is thinner than the light emitting unit 140, the effect of the strain of the first stacked body 210 can be transmitted not only to the light emitting unit 140 but also to the second stacked body 220. The effect of the strain of the second stacked body 220 is strongly received by the first stacked body 210. Thus, an interaction effectively occurs therebetween.

In the semiconductor device 14 according to the embodiment, the light emission efficiency was nearly constant up to a driving current of 350 mA. At that driving current, an output of 0.6 W was obtained.

In a semiconductor device similar in configuration to the embodiment, if the average In concentration in the second stacked body 220 continuously decreased and failed to form a region with a constant composition, or if the average In concentration was not constant also in the first stacked body 210, then the light emission efficiency decreased with the increase of injection current density. The optical output at a driving current of 350 mA was 0.55 W or less.

In the embodiment, the crystal (second stacked body 220) having the In composition distribution described above can be fabricated by adjusting the superlattice structure of GaN and GaInN. Primarily, the thickness and period are adjusted. For instance, the thickness of the GaN layer is e.g. 2.5 nm. The thickness of the GaInN layer is e.g. 1 nm. The In concentration is approximately 0.5%. The period (the number of GaN layers and the number of GaInN layers) is 12-27. For instance, more preferably, the period is 16-20.

By growing a second stacked body 220 having an average In composition profile as described above and growing thereon a first stacked body 210 having an average In composition profile as described above, a semiconductor light emitting device with high efficiency can be formed. It is presumed that the possibility of this formation can be attributed to the following mechanism.

A recess is formed around the dislocation 510. The recess is taken over to the first stacked body 210 (AlGaInN layers and GaInN layers) and the light emitting unit 140 while maintaining the shape with the dislocation 510 directed in the generally vertical direction. It is considered that the recess extends toward the surface with the substantially vertical direction left unchanged. The shape of the recess (depression 210d) is opened toward the surface (to the direction from the first layer 130 toward the second layer 150). It is presumed that the recess assumes a generally axisymmetric shape (such as a circular cone, trigonal pyramid, and hexagonal pyramid) with respect to the dislocation.

The depression 210d formed in the first stacked body 210 is filled with part of the light emitting unit 140. For instance, it can be observed in the cross-sectional TEM image that the well layer 42 (InGaN layer) and the barrier layer 41 (AlGaInN layer) are stacked symmetrically with respect to the dislocation 510 coinciding with the central axis of the depression 210d.

The thickness of the first stacked body 210 is thicker than the depth of the depression 210d formed in the first stacked body 210. If the depression 210d penetrates through the first stacked body 210, for instance, this causes leakage of carriers. To suppress this, the configuration (primarily the thickness and period) of the first stacked body 210 is appropriately designed. For instance, the thickness of the AlGaInN layer is e.g. 2 nm. The thickness of the GaInN layer is e.g. 1 nm. The period (the number of AlGaInN layers and the number of GaInN layers) is e.g. 30.

If the dislocation 510 penetrating through the light emitting unit 140 is directed vertically, the proportion of the area of the portion disturbed by the dislocation 510 to the area of the light emitting unit 140 is decreased. This increases the light emission efficiency. Furthermore, if the dislocation 510 is directed vertically, the current becomes less likely to flow therein, and the leakage of current is suppressed. Moreover, the In concentration around the dislocation 510 is decreased. Thus, the bandgap energy around the dislocation 510 is increased. This suppresses lateral current toward the dislocation 510 and reduces the leakage current. Furthermore, the relative area ratio of the region where the crystal around the dislocation 510 is disturbed is decreased. This improves the quality of the second layer 150 grown on the light emitting unit 140. Furthermore, the manufacturing yield is improved.

In forming the stacked body, if the growth rate is slowed down, the incorporation efficiency of Al (strongly coupled to nitrogen) into the crystal surface is made higher than the incorporation efficiency of In (weakly coupled to nitrogen) and Ga (moderately coupled to nitrogen) into the crystal surface. Thus, by using the first stacked body 210 based on AlGaInN layers and GaInN layers, a region with high Al composition is formed more easily around the dislocation 510. This suppresses current flow into the dislocation 510 and suppresses leakage current.

In a layer with high Al concentration, the direction of the dislocation 510 is easily changed from vertical. It is considered that the shape of the depression 210d is stabilized by supplying In, which is weakly coupled to nitrogen and facilitates the motion of atoms at the crystal surface, during the formation of the AlGaInN layer.

Furthermore, by repetitively forming thin AlGaInN layers and thin GaInN layers, the GaInN layer having high In concentration and easily assuming a thermodynamically stable state is formed before the shape of the depression 210d is significantly varied during the formation of the AlGaInN layer. It is considered that this stabilizes the shape of the depression 210d.

Thus, by providing a first stacked body 210 in which a plurality of AlGaInN layers and a plurality of GaInN layers are alternately stacked, the dislocation 510 is formed vertically in the light emitting unit 140. This improves the efficiency.

In the semiconductor device 14 (and 14a-14c) according to the embodiment, the light emitting unit 140 can have various configurations, compositions, and emission wavelengths described with reference to the other embodiments.

(Fifth Embodiment)

Figure 11:
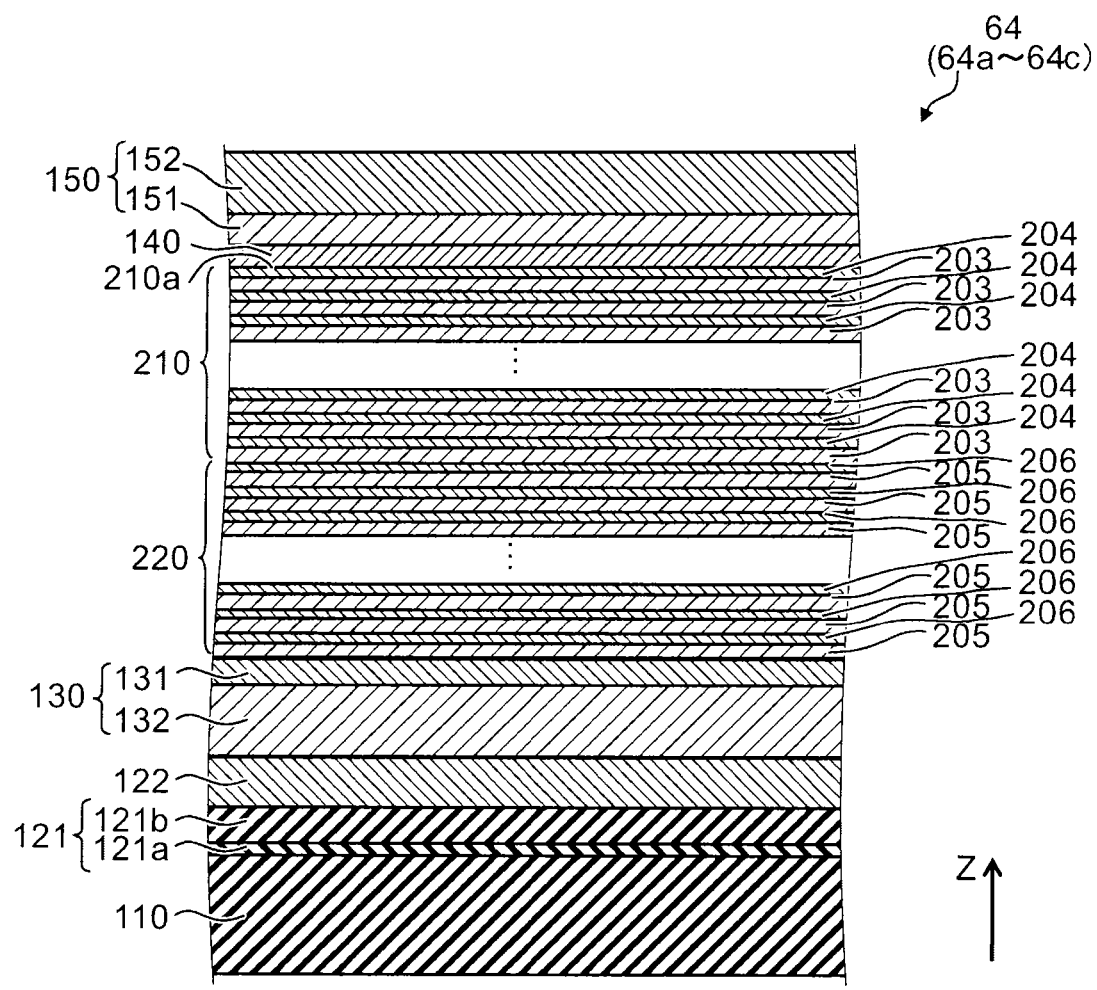
FIG. 11 is a schematic sectional view illustrating a wafer according to a fifth embodiment.

FIG. 11 is a schematic sectional view illustrating the configuration of a wafer according to a fifth embodiment.

As shown in FIG. 11, the wafer 64 (and 64a-64c) according to the embodiment includes a first layer 130, a second layer 150, a light emitting unit 140, a first stacked body 210, and a second stacked body 220. The first layer 130 includes a nitride semiconductor and has n-type. The second layer 150 includes a nitride semiconductor and has p-type. The light emitting unit 140 is provided between the first layer 130 and the second layer 150. The light emitting unit 140 includes a barrier layer 41 and a well layer 42. For instance, a plurality of barrier layers 41 are provided. The well layer 42 is provided between the plurality of barrier layers 41.

The first stacked body 210 is provided between the first layer 130 and the light emitting unit 140. The first stacked body 210 includes a plurality of third layers 203 including AlGaInN, and a plurality of fourth layers 204 alternately stacked with the plurality of third layers and including GaInN.

The second stacked body 220 is provided between the first layer 130 and the first stacked body 210. The second stacked body 220 includes a plurality of fifth layers 205 and a plurality of sixth layers 206. The plurality of fifth layers 205 have a composition different from the composition of the third layers 203 and include a nitride semiconductor. The plurality of sixth layers 206 are alternately stacked with the plurality of fifth layers 205 and include GaInN.

As illustrated in FIG. 10, the second stacked body 220 includes a first portion 220a near the first layer 130 and a second portion 220b located between the first portion 220a and the light emitting unit 140. The In average concentration in the first portion 220a is higher than the In average concentration in the second portion 220b.

Thus, the embodiment can provide a wafer having high efficiency.

(Sixth Embodiment)

Figure 12:
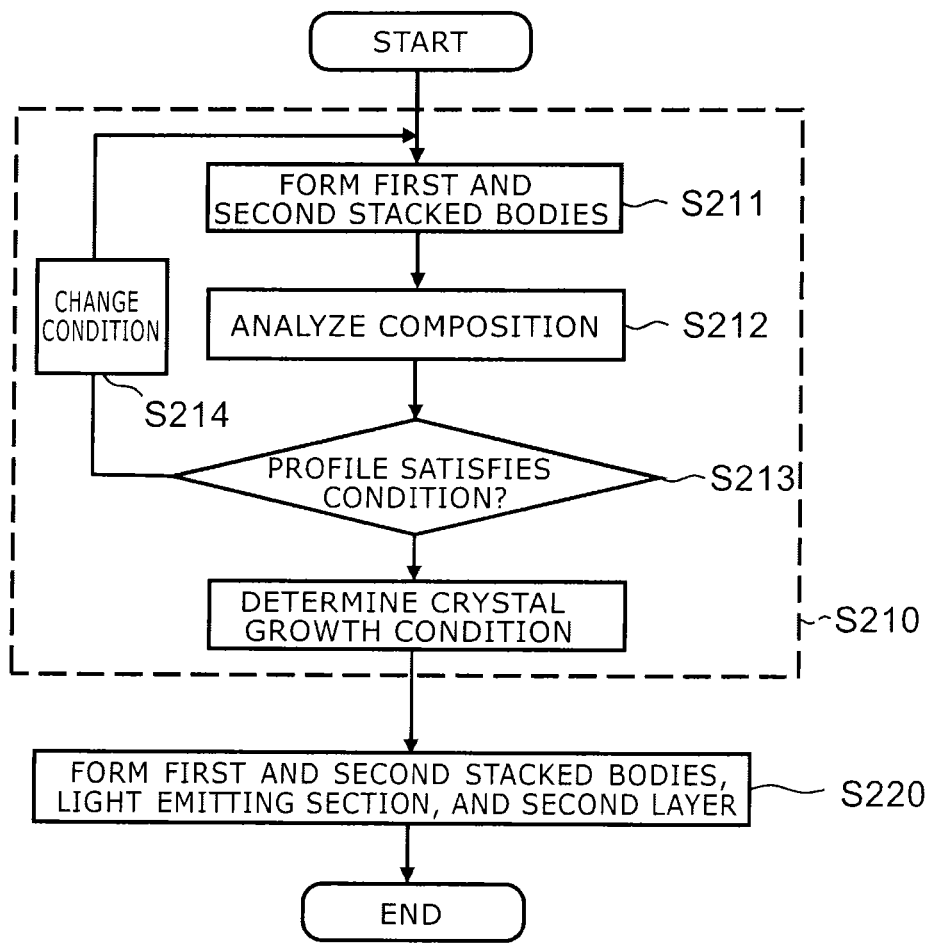
FIG. 12 is a flow chart illustrating a method for manufacturing a semiconductor device according to a sixth embodiment.

FIG. 12 is a flow chart illustrating a method for manufacturing a semiconductor device according to a sixth embodiment.

As shown in FIG. 12, in the method for manufacturing a semiconductor device according to the embodiment, the crystal growth condition is determined (step S210). Then, by using the determined crystal growth condition, a second stacked body 220, a first stacked body 210, a light emitting unit 140, and a second layer 150 are formed (step S220).

For instance, on a first layer 130 of n-type including a nitride semiconductor, a plurality of fifth layers 205 including a nitride semiconductor and a plurality of sixth layers 206 including GaInN are alternately stacked to form a second stacked body 220. Then, on the second stacked body 220, a plurality of third layers 203 having a composition different from that of the fifth layer 205 and including AlGaInN, and a plurality of fourth layers 204 including GaInN are alternately stacked to form a first stacked body 210 (step S211).

Then, composition analysis of In in the second stacked body 220 is performed (step S212).

The second stacked body 220 is assumed to include a first portion 220a near the first layer 130 and a second portion 220b farther from the first layer 130 than the first portion 220a. From the result of the composition analysis, it is determined whether the In composition profile of the second stacked body 220 satisfies the condition that the In average concentration in the first portion 220a is higher than the In average concentration in the second portion 220b (step S213). If the result of this determination is NO, the condition (the condition including at least one of the crystal growth condition and the wafer structure) is changed (step S214). Then, the process returns to step S211. The process is repeated until the result of the determination becomes YES.

On the other hand, if the result of the composition analysis is YES (if the In composition profile of the second stacked body 220 satisfies the condition that the In average concentration in the first portion 220a is higher than the In average concentration in the second portion 220b), the crystal growth condition is determined (step S210). Thus, the crystal growth condition is determined so that the In average concentration in the first portion 220a of the second stacked body 220 near the first layer 130 is higher than the In average concentration in the second portion 220b of the second stacked body 220 which is farther from the first layer 130 than the first portion 220a.

Then, by using the determined crystal growth condition, a second stacked body 220 and a first stacked body 210 are formed. On the first stacked body 210, a light emitting unit 140 including a barrier layer 41 and a well layer 42 is formed. On the light emitting unit 140, a second layer 150 of p-type including a nitride semiconductor is formed (step S220). Thus, the semiconductor device is formed.

This manufacturing method can provide a method for manufacturing a semiconductor device having high efficiency.

For instance, on a substrate 110, a first layer 130 of n-type including a nitride semiconductor is formed. On the first layer 130, a second stacked body 220 is formed. On the second stacked body 220, a first stacked body 210 is formed.

Then, on the first stacked body 210, a light emitting unit 140 including a barrier layer 41 and a well layer 42 is formed. On the light emitting unit 140, a second layer 150 of p-type including a nitride semiconductor is formed.

Next, for instance, by SIMS, the In composition profile of the first stacked body 210 and the In composition profile of the second stacked body 220 are measured.

Then, it is determined whether a prescribed average In composition profile has been obtained. The prescribed average In composition profile is defined as follows. In the second stacked body 220, there are a region where the average In concentration is high on the first layer 130 side and decreases on the functional region side (light emitting unit 140 side), and a region where the average In concentration is nearly constant. In the first stacked body 210, the average In concentration is nearly constant. If the prescribed average In concentration profile has been obtained, the crystal growth condition and the wafer structure are finalized. If the intended profile has not been obtained, the crystal growth condition is modified. Then, the process from step S211 is performed again. If the prescribed average In concentration profile is obtained, crystal growth is performed by using the finalized crystal growth condition and wafer structure. Thus, a wafer enabling fabrication of a high output semiconductor device can be fabricated. Furthermore, by using this wafer, the device production process is performed to fabricate a semiconductor device. Thus, a semiconductor device with high efficiency can be manufactured.

The high efficiency of the semiconductor device according to the above embodiments is attributable to the following point, for instance. The portion around the dislocation is filled with the stacked structure of AlGaInN and GaInN having a larger bandgap than that of the flat portion. Thus, the active region and the region for injecting a current therein are effectively separated from the portion around the dislocation.

In one embodiment, for instance, a first stacked body 210 is formed on a GaN layer. In the first stacked body 210, a plurality of layers including AlGaInN and a plurality of layers including GaInN are alternately stacked. A functional region (functional section) is formed thereon. A structure for current injection or current extraction for the functional region is provided. A depression is formed in the surface of the first stacked body 210. For instance, in this structure, the thickness of the functional region or the peripheral portion of the depression is thinned in the depression.

For instance, the semiconductor device according to the embodiment includes a first layer including a nitride semiconductor, a first stacked body provided on the first layer, and a functional section provided on the first stacked body and including a nitride semiconductor. The first stacked body includes a plurality of third layers including AlGaInN and a plurality of fourth layers alternately stacked with the plurality of third layers and including GaInN. The first stacked body includes a depression provided in the surface on the functional section side of the first stacked body. Part of the light emitting unit is embedded in at least part of the depression.

In one embodiment, for instance, on a GaN layer, a second stacked body 220 is formed. In the second stacked body 220, a plurality of layers having a composition different from AlGaInN and including a nitride semiconductor, and a plurality of layers including GaInN are alternately stacked. A first stacked body 210 is formed thereon. In the first stacked body 210, a plurality of layers including AlGaInN and a plurality of layers including GaInN are alternately stacked. A functional region (functional section) is formed thereon. A structure for current injection or current extraction for the functional region is provided. The following structure is provided. In the second stacked body 220, there are a region where the average In concentration is high on the GaN layer side and decreases on the functional region side, and a region where the average In composition is nearly constant. In the first stacked body 210, the average In concentration is nearly constant.

For instance, the semiconductor device according to the embodiment includes a first layer including a nitride semiconductor, a first stacked body provided on the first layer, a second stacked body provided between the first layer and the first stacked body, and a functional section provided on the first stacked body and including a nitride semiconductor. The first stacked body includes a plurality of third layers including AlGaInN and a plurality of fourth layers alternately stacked with the plurality of third layers and including GaInN. The second stacked body includes a plurality of fifth layers having a composition different from the composition of the third layer and including a nitride semiconductor, and a plurality of sixth layers alternately stacked with the plurality of fifth layers and including GaInN. The second stacked body includes a first portion near the first layer and a second portion located between the first portion and the functional section. The In average concentration in the first portion is higher than the In average concentration in the second portion.

The embodiments are applicable to all the semiconductor devices and wafers having such configurations.

For instance, the embodiments are applicable to various optical semiconductor devices such as semiconductor laser devices and light receiving devices, current or voltage controlling semiconductor devices such as diodes, transistors, field effect transistors, and thyristors, and combinations thereof.

The embodiments can provide a semiconductor device, a wafer, a method for manufacturing a semiconductor device, and a method for manufacturing a wafer having high efficiency.

In the description, the "nitride semiconductor" includes semiconductors of the chemical formula $B_xIn_yAl_zGa_{1-x-y-z}N$ ($0 \leq x \leq 1$, $0 \leq y \leq 1$, $0 \leq z \leq 1$, $x+y+z \leq 1$) of any compositions with the concentrations x, y, and z varied in the respective ranges. Furthermore, the "nitride semiconductor" also includes those of the above chemical formula further containing group V elements other than N (nitrogen), those further containing various elements added for controlling various material properties such as conductivity type, and those further containing various unintended elements.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

The embodiments of the invention have been described above with reference to examples. However, the embodiments of the invention are not limited to these examples. For instance, any specific configurations of various components such as the semiconductor layer, light emitting unit, well layer, barrier layer, stacked body, electrode, substrate, buffer layer, and depression included in the semiconductor device are encompassed within the scope of the invention as long as those skilled in the art can similarly practice the invention and achieve similar effects by suitably selecting such configurations from conventionally known ones.

Further, any two or more components of the specific examples may be combined within the extent of technical feasibility and are included in the scope of the invention to the extent that the purport of the invention is included.

In addition, those skilled in the art can suitably modify and implement the semiconductor device, the wafer, the method for manufacturing a semiconductor device, and the method for manufacturing a wafer described above in the embodiments of the invention. All the semiconductor devices, the wafers, the methods for manufacturing a semiconductor device, and the methods for manufacturing a wafer thus modified are also encompassed within the scope of the invention as long as they fall within the spirit of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a first layer of n-type including a nitride semiconductor;
   a second layer of p-type including a nitride semiconductor;
   a light emitting unit provided between the first layer and the second layer, the light emitting unit including a barrier layer and a well layer; and
   a first stacked body provided between the first layer and the light emitting unit, the first stacked body including:
      a plurality of third layers including AlGaInN; and
      a plurality of fourth layers alternately stacked with the plurality of third layers and including GaInN,
   the first stacked body having a first surface facing the light emitting unit, the first stacked body having a depression provided in the first surface,
   a part of the light emitting unit being embedded in at least a part of the depression, and a part of the second layer being disposed on the part of the light emitting unit embedded in the at least a part of the depression;
further comprising a dislocation penetrating through the first layer, the first stacked body, the light emitting unit, and the second layer,
a side surface of the depression surrounds the dislocation,
the first stacked body includes a first region and a second region, a first distance between the first region and the dislocation is shorter than a second distance between the second region and the dislocation, and
a first Al concentration in the first region is higher than a second Al concentration in the second region.

2. The device according to claim 1, wherein the part of the second layer is further embedded in the at least part of the depression.

3. The device according to claim 1, wherein a thickness of each of the fourth layers is thinner than a thickness of the well layer.

4. The device according to claim 1, wherein the depression does not penetrate through the first stacked body.

5. The device according to claim 1, further comprising:
a second stacked body provided between the first layer and the first stacked body, the second stacked body including:
a plurality of fifth layers having a composition different from a composition of the third layers and including a nitride semiconductor; and
a plurality of sixth layers alternately stacked with the plurality of fifth layers and including GaInN.

6. The device according to claim 5, wherein the plurality of fifth layers include GaN, and a thickness of each of the plurality of fifth layers is thinner than a thickness of the plurality of barrier layers.

7. The device according to claim 5, further comprising: an intermediate layer provided between the first stacked body and the second stacked body and having a thickness thinner than a thickness of the light emitting unit.

8. The device according to claim 1, wherein the well layer includes at least one of GaInN and AlGaInN.

9. The device according to claim 1, wherein a first barrier layer of the plurality of barrier layers nearest to the first stacked body includes AlGaInN.

10. A semiconductor device comprising:
a first layer of n-type including a nitride semiconductor;
a second layer of p-type including a nitride semiconductor;
a light emitting unit provided between the first layer and the second layer, the light emitting unit including a barrier layer and a well layer;
a first stacked body provided between the first layer and the light emitting unit, the first stacked body including:
a plurality of third layers including AlGaInN; and
a plurality of fourth layers alternately stacked with the plurality of third layers and including GaInN; and
a second stacked body provided between the first layer and the first stacked body, the second stacked body including:
a plurality of fifth layers having a composition different from a composition of the third layers and including a nitride semiconductor; and
a plurality of sixth layers alternately stacked with the plurality of fifth layers and including GaInN,
the second stacked body including a first portion near the first layer and a second portion located between the first portion and the light emitting unit, and
an In average concentration in the first portion being higher than an In average concentration in the second portion.

11. The device according to claim 10, wherein
the In average concentration in the first portion decreases from a side of the first layer toward a side of the second layer, and
a variation of the In average concentration in the second portion is smaller than a variation of the In average concentration in the first portion.

12. The device according to claim 10, wherein a variation along a direction from the first layer toward the second layer of an In average concentration in the first stacked body is smaller than a variation along the direction of an In average concentration in the second stacked body.

13. The device according to claim 10, wherein the plurality of fifth layers include GaN, and a thickness of each of the plurality of fifth layers is thinner than a thickness of each of the plurality of barrier layers.

14. The device according to claim 10, further comprising:
an intermediate layer provided between the first stacked body and the second stacked body and having a thickness thinner than a thickness of the light emitting unit.

15. The device according to claim 10, wherein the well layer includes at least one of GaInN and AlGaInN.

16. The device according to claim 10, wherein a first barrier layer of the plurality of barrier layers nearest to the first stacked body includes AlGaInN.

17. A wafer comprising:
a substrate;
a first layer of n-type provided on the substrate and including a nitride semiconductor;
a first stacked body provided on the first layer, the first stacked body including:
a plurality of third layers including AlGaInN; and
a plurality of fourth layers alternately stacked with the plurality of third layers and including GaInN;
a light emitting unit provided on the first stacked body, the light emitting unit including a plurality of barrier layers and a well layer provided between the plurality of barrier layers; and
a second layer of p-type provided on the light emitting unit and including a nitride semiconductor,
the first stacked body having a first surface facing of the light emitting unit, the first stacked body having a depression provided in the first surface, and
a part of the light emitting unit and a part of the second layer being embedded in at least a part of the depression;
further comprising a dislocation penetrating through the first layer, the first stacked body, the light emitting unit, and the second layer,
a side surface of the depression surrounds the dislocation,
the first stacked body includes a first region and a second region, a first distance between the first region and the dislocation is shorter than a second distance between the second region and the dislocation, and
a first Al concentration in the first region is higher than second Al concentration in the second region.

18. A wafer comprising:
a first layer of n-type including a nitride semiconductor;
a second layer of p-type including a nitride semiconductor;
a light emitting unit provided between the first layer and the second layer, the light emitting unit including a plurality of barrier layers and a well layer provided between the plurality of barrier layers;
a first stacked body provided between the first layer and the light emitting unit, the first stacked body including:
a plurality of third layers including AlGaInN; and
a plurality of fourth layers alternately stacked with the plurality of third layers and including GaInN; and a second stacked body provided between the first layer and the first stacked body, the second stacked body including:
   a plurality of fifth layers having a composition different from a composition of the third layers and including a nitride semiconductor; and
   a plurality of sixth layers alternately stacked with the plurality of fifth layers and including GaInN,
the second stacked body including a first portion near the first layer and a second portion located between the first portion and the light emitting unit, and
an In average concentration in the first portion being higher than an In average concentration in the second portion.

* * * * *